(12) United States Patent
Keeth et al.

(10) Patent No.: US 11,281,608 B2
(45) Date of Patent: Mar. 22, 2022

(54) TRANSLATION SYSTEM FOR FINER GRAIN MEMORY ARCHITECTURES

(71) Applicant: Micron Technology, Inc., Boise, ID (US)

(72) Inventors: Brent Keeth, Boise, ID (US); Richard C. Murphy, Boise, ID (US); Elliott C. Cooper-Balis, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 15 days.

(21) Appl. No.: 16/058,868

(22) Filed: Aug. 8, 2018

(65) Prior Publication Data

US 2019/0179769 A1    Jun. 13, 2019

Related U.S. Application Data

(60) Provisional application No. 62/597,304, filed on Dec. 11, 2017.

(51) Int. Cl.
*G06F 13/28* (2006.01)
*G06F 12/10* (2016.01)
(Continued)

(52) U.S. Cl.
CPC ............ *G06F 13/28* (2013.01); *G06F 3/0659* (2013.01); *G06F 3/0661* (2013.01); *G06F 12/10* (2013.01); *G06F 12/1027* (2013.01); *G06F 13/1668* (2013.01); *H01L 23/5385* (2013.01); *H01L 23/5386* (2013.01); *G06F 2212/65* (2013.01); *H01L 25/0652* (2013.01); *H01L 25/0657* (2013.01); *H01L 25/18* (2013.01); *H01L 2225/0652* (2013.01); *H01L 2225/06513* (2013.01); *H01L 2225/06517* (2013.01); *H01L 2225/06541* (2013.01); (Continued)

(58) Field of Classification Search
None
See application file for complete search history.

(56) References Cited

U.S. PATENT DOCUMENTS 6,185,654 B1  2/2001  Van
7,827,336 B2  11/2010  Miller et al.
(Continued)

OTHER PUBLICATIONS

JESD235A, JEDEC Standard High Bandwidth Memory DRAM, Nov. 2015, JEDEC, pp. 1-172.

*Primary Examiner* — Charles Rones
*Assistant Examiner* — Jonah C Krieger
(74) *Attorney, Agent, or Firm* — Holland & Hart LLP

(57) ABSTRACT

Systems and techniques for a translation device that is configured to enable communication between a host device and a memory technology using different communication protocols (e.g., a communication protocol that is not pre-configured in the host device) is described herein. The translation device may be configured to receive signals from the host device using a first communication protocol and transmit signals to the memory device using a second communication protocol, or vice-versa. When converting signals between different communication protocols, the translation device may be configured to convert commands, map memory addresses to new addresses, map between channels having different characteristics, encode data using different modulation schemes, or a combination thereof.

23 Claims, 16 Drawing Sheets

(51) Int. Cl.
*H01L 23/538* (2006.01)
*G06F 13/16* (2006.01)
*G06F 3/06* (2006.01)
*G06F 12/1027* (2016.01)
*H01L 25/065* (2006.01)
*H01L 25/18* (2006.01)

(52) U.S. Cl.
CPC ............... *H01L 2225/06565* (2013.01); *H01L 2225/06586* (2013.01); *H01L 2924/1434* (2013.01); *H01L 2924/15192* (2013.01); *H01L 2924/15311* (2013.01)

(56) References Cited

U.S. PATENT DOCUMENTS

| | | | |
|---|---|---|---|
| 8,233,303 B2 | 7/2012 | Best et al. | |
| 8,254,191 B2 | 8/2012 | Jeddeloh et al. | |
| 8,386,722 B1 | 2/2013 | Wang et al. | |
| 8,797,779 B2 | 8/2014 | Rajan et al. | |
| 8,885,380 B2 | 11/2014 | Kang et al. | |
| 8,922,243 B2 | 12/2014 | Jayasena et al. | |
| 9,065,722 B2 | 6/2015 | Thottethodi et al. | |
| 9,135,185 B2 | 9/2015 | Loh et al. | |
| 9,136,842 B2 | 9/2015 | Rahman et al. | |
| 9,158,619 B2 | 10/2015 | Kobla et al. | |
| 9,170,948 B2 | 10/2015 | Loh et al. | |
| 9,171,585 B2 | 10/2015 | Rajan et al. | |
| 9,298,395 B2 | 3/2016 | Coteus et al. | |
| 9,406,403 B2 | 8/2016 | Loh et al. | |
| 9,570,147 B2 | 2/2017 | Kim | |
| 9,697,147 B2 | 7/2017 | Loh et al. | |
| 9,767,028 B2 | 9/2017 | Cheng et al. | |
| 9,995,785 B2 | 6/2018 | Pappu et al. | |
| 10,079,044 B2 | 9/2018 | Jayasena et al. | |
| 10,152,244 B2 | 12/2018 | Roberts | |
| 10,180,906 B2 | 1/2019 | Stocksdale et al. | |
| 10,282,309 B2 | 5/2019 | Jayasena et al. | |
| 10,410,694 B1 | 9/2019 | Arbel et al. | |
| 2002/0015342 A1 | 2/2002 | Kuge | |
| 2006/0235577 A1 | 10/2006 | Ikeda et al. | |
| 2008/0320268 A1* | 12/2008 | Wingard | G11C 7/1072 711/202 |
| 2009/0292798 A1* | 11/2009 | Basham | G06F 3/0626 709/223 |
| 2010/0265909 A1* | 10/2010 | Petite | H04L 27/0008 370/329 |
| 2013/0173846 A1* | 7/2013 | Lassa | G06F 3/0688 711/103 |
| 2013/0214432 A1 | 8/2013 | Wu et al. | |
| 2014/0115281 A1* | 4/2014 | Coteus | G06F 1/3275 711/154 |
| 2014/0175665 A1* | 6/2014 | Kang | H01L 25/0655 257/774 |
| 2014/0181458 A1 | 6/2014 | Loh et al. | |
| 2015/0255434 A1* | 9/2015 | Yazdani | H01L 25/50 257/737 |
| 2016/0141419 A1* | 5/2016 | Baenninger | H01L 27/11551 257/314 |
| 2016/0163609 A1 | 6/2016 | Rahman et al. | |
| 2017/0068769 A1* | 3/2017 | Singh | G06F 30/398 |
| 2017/0251513 A1* | 8/2017 | Engelien-Lopes | H04W 76/14 |
| 2018/0032437 A1* | 2/2018 | Stocksdale | G06F 12/0893 |
| 2018/0184435 A1* | 6/2018 | Cariou | H04W 36/0061 |
| 2019/0121775 A1 | 4/2019 | Johnson et al. | |
| 2019/0287584 A1 | 9/2019 | Hollis | |
| 2020/0145350 A1* | 5/2020 | Treue | H04B 1/006 |

* cited by examiner

TRANSLATION SYSTEM FOR FINER GRAIN MEMORY ARCHITECTURES

CROSS REFERENCE

The present Application for Patent claims priority to and the benefit of U.S. Provisional Patent Application No. 62/597,304 by Keeth et al., entitled "Translation System for Finer Grain Memory Architectures," filed Dec. 11, 2017, assigned to the assignee hereof, and is expressly incorporated by reference herein.

BACKGROUND

The following relates generally to devices and methods for a translation system for finer grain memory architectures.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile.

Improving memory devices, generally, may include increasing memory cell density, increasing read/write speeds, increasing reliability, increasing data retention, reducing power consumption, or reducing manufacturing costs, among other metrics. Advancing memory technology has realized improvements for many of these metrics, but high reliability, low latency, and/or low-power devices tend to be expensive and unscalable. As the quantity of applications for high reliability, low latency, low-power memory increases, so too does the need for scalable, efficient, and cost-effective devices for such applications.

DETAILED DESCRIPTION

In some computing devices, a host device (e.g., processor, graphics processing unit) is configured to interact with a specific memory technology or set of memory technologies. As technologies for memory devices improve or additional applications and operations change, it may be desirable to integrate new memory technology into computing devices. In certain scenarios, reconfiguring other components of the computing devices (e.g., the host device) may not be practical or cost effective when integrating new memory technology.

A translation device configured to enable communication between a host device and a memory technology using different communication protocols (e.g., a communication protocol that is not preconfigured in the host device) is described herein. The translation device may be configured to receive signals from the host device using a first communication protocol and transmit signals to the memory device using a second, different communication protocol, or vice-versa. When converting signals between different communication protocols, the translation device may be configured to convert commands, map memory addresses to new addresses, map between channels having different characteristics, perform other operations, or a combination thereof.

Features of the disclosure introduced above are described below in the context of FIGS. 1-14. These and other features of the disclosure are illustrated by and described with reference to apparatus diagrams, system diagrams, and flowcharts that relate to devices and methods for reconfigurable memory architectures.

Figure 1:
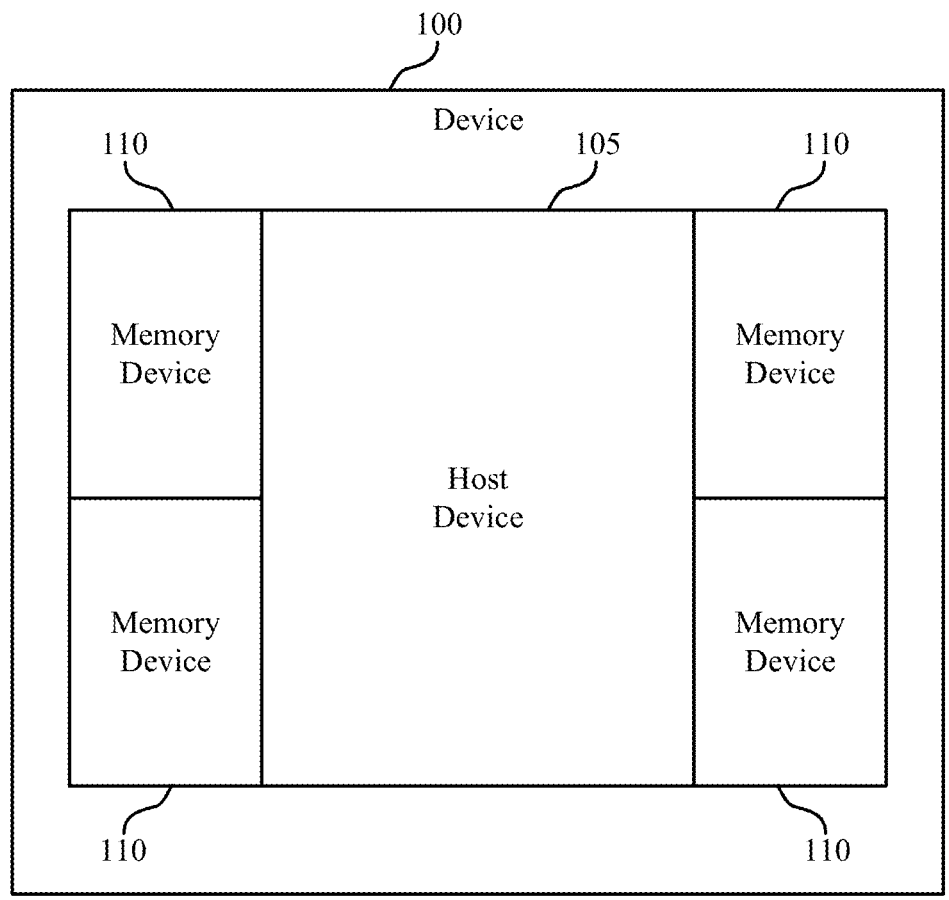
FIG. 1 illustrates an example of a device that supports a translation system for finer grain memory architectures in accordance with embodiments of the present disclosure.

FIG. 1 illustrates an example of a device 100 that supports a translation system for finer grain memory architectures in accordance with various embodiments of the present disclosure. The device 100 may include a host device 105 and a plurality of memory devices 110. The plurality of memory device 110 may be examples a finer grain memory device (e.g., finer grain DRAM, finer grain FeRAM, PCM).

The host device 105 may be an example of a processor (e.g., a central processing unit (CPU), a graphics processing unit (GPU)) or a system on a chip (SoC). In some cases, the host device 105 may be a separate component from the memory device such that the host device 105 may be manufactured separately from the memory device, and the device 100 may be a constructed from discrete components, including the host device 105 and memory devices 110. In some cases, the host device 105 may be external to the memory device 110 (e.g., a laptop, server, personal computing device, smartphone, personal computer). In the device 100, the memory devices 110 may be configured to write data from, read data to, or store data for the host device 105. The host device 105 may exchange information with the memory devices 110 using signals communicated over signal paths, which may be referred to as channels. In some cases, the signal paths at least partially include (or are constructed within) an interposer (e.g., a silicon interposer, e.g., an organic interposer).

In some situations, the device 100 may employ a high-speed connection between the host device 105 and the memory devices 110. As such, some memory devices 110 support applications, processes, host devices, or components such as processors that have multiple terabytes per second (TB/s) bandwidth needs. Satisfying such a bandwidth requirement within an acceptable energy budget poses challenges.

The memory devices 110 may be configured such that a length or lengths associated with the signal path between the memory cells in the memory devices 110 and the host device 105 is or are sized to accommodate certain specifications or physical constraints (e.g., the signal paths may be as short as possible to achieve a desired performance metric). For example, the memory devices 110 may be bufferless memory devices. In another example, the data channels coupling a memory device 110 with the host device 105 may be configured to be shorter than previous designs.

The host device 105 may be configured to communicate with a memory device that implements a particular type of memory technology. In such cases, the host device 105 may be configured to communicate with memory devices using a "native" protocol (e.g., the communication protocol associated with the expected memory technology of the memory device). For example, the host device 105 may be configured to couple with a high bandwidth memory (HBM) device and may be configured to communicate using an HBM communication protocol, or another protocol defined by an industry standardized specification (e.g., a JEDEC specification).

If a memory device that implements a different memory technology, other than the expected (i.e., native) memory technology, is coupled with the host device 105, the host device 105 may not be able to communicate with the new memory device due to different communication protocols or other technology differences. In some cases, the host device 105 may be configured to communicate with a specific type of memory device within a memory device technology such that even changing the type of memory device may make communication between the host device 105 and the memory device 110 impossible (e.g., HBM2, as defined by JEDEC). In such cases, deviations from a host device's "native" communication protocol and expected memory technology may render the device 100 in operable or severely limited in its function. Device 100 may therefore be equipped with components and devices, such as a translation system for finer grain memory architectures, and may employ techniques as described herein for enabling a host device 105 to a communicate with a different memory technology other than the memory technology the host device 105 is preconfigured to use.

Figure 2:
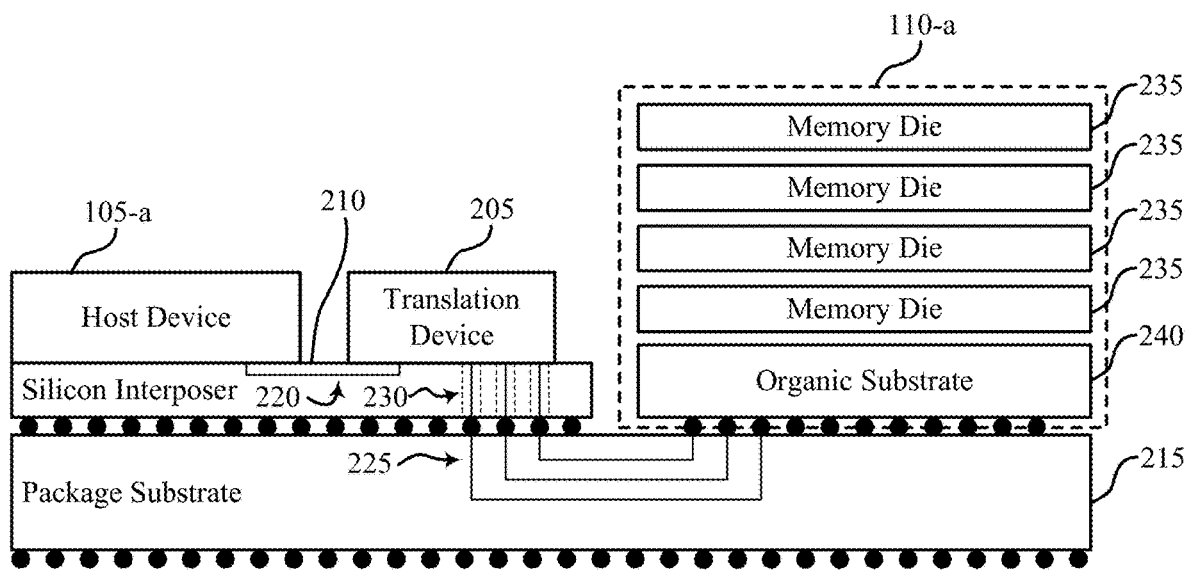
FIG. 2 illustrates an example of a device that supports a translation system for finer grain memory architectures in accordance with embodiments of the present disclosure.

FIG. 2 illustrates an example of a device 200 that supports a translation system for finer grain memory architectures in accordance with various embodiments of the present disclosure. The device 200 may be an example of the device 100 described with reference to FIG. 1. The device 200 may include a translation device 205 configured to enable communications between a host device 105-a and a memory device 110-a that implements a different memory technology than what is expected by or used by the host device 105-a.

The host device 105-a may be configured to communicate with a specific set of memory technologies. In such cases, the host device 105-a may not be configured to communicate with memory technologies not included in the specific set. For example, a host device 105-a may be configured to communicate with an HBM device using a silicon interposer (e.g., the silicon interposer 210). But not all memory devices are configured to interface with silicon interposers. Such memory devices may, in some examples, use a different communication protocol than what is used by the specific set of memory technologies.

The translation device 205 may be configured to convert signals encoded using a communication scheme of the host device 105-a (also referred to as "HD communication scheme") into signals encoded using a communication scheme of the memory device 110-a (also referred to as "MD communication scheme") or vice-versa. The translation device 205 may enable the host device 105-a to communicate with additional types of memory devices 110-a without the host device 105-a being reconfigured. The translation device 205 may convert commands for the HD communication scheme into commands of the MD communication scheme or vice-versa. The translation device 205 may convert addresses of the HD communication scheme into addresses of the MD communication scheme or vice-versa.

In some cases, the host device 105-a may include an interface having a first pin layout. The memory device 110-a may include an interface having a second pin layout that is different from the first pin layout. In such cases, the translation device 205 may be configured map the channels and pins of the host device 105-a to the channels and pins of the memory device 110-a and vice-versa.

For example, the device 200 may include a silicon interposer 210 and a package substrate 215. The package substrate 215 may, in some examples, be an example of an organic substrate. The host device 105-a may be coupled with and/or positioned on the silicon interposer 210. The host device 105-a may be configured to communicate using channels 220 comprising wiring in a silicon interposer. Wiring within a silicon interposer may include many small pins that are resistive (e.g., fairly resistive as compared to other types of pins and wiring such as wiring in an organic substrate). Thus, the maximum operating frequency of the channels 220 may be less than a maximum operating frequency of channels 225 that may include other types of wiring (e.g., wiring within an organic substrate).

The translation device 205 may be configured to couple with the channels 220 associated with the host device 105-*a* and the channels 225 associated with the memory device 110-*a*. The translation device 205 may be coupled with and/or positioned on the silicon interposer 210. In some cases, the translation device 205 may be configured to be positioned in a location associated with a memory device of the host device's specific memory technology. For example, the translation device 205 may be configured to be positioned within a footprint of an HBM device on the silicon interposer 210, which may in some cases allow for more compact component positioning, higher density memory construction, and other advantages.

The memory device 110-*a* may be coupled with and/or positioned on the package substrate 215. In some examples, this may be because the memory device 110-*a* may or may not include an interface configured for a silicon interposer. In some examples, this may be because the memory device 110-*a* is configured to be separated from the other components in the case of failure or new memory technologies, allowing for additional customization and other distinct advantages. The translation device 205 may communicate with the memory device 110-*a* using the channels 225. Because the translation device 205 may be positioned on the silicon interposer 210, at least a portion 230 of the channels 225 may extend through the silicon interposer 210 to reach the translation device 205. In some cases, the portion 230 of the channels 225 may comprise wiring in an organic substrate that extends through the silicon interposer 210. In such cases, the wiring within the organic substrate may be tunneled through the silicon interposer 210, among other methods. In some cases, the portion 230 of the channels 225 may comprise wiring within the silicon interposer such that portions of the channels 225 are wiring within the silicon interposer and other portions are wiring within the organic substrate.

The memory device 110-*a* may, in some examples, include at least one memory die 235 and an organic substrate 240. The memory die 235 may include a plurality of memory cells (as shown in and described with reference to FIG. 9) that may be programmable to store different logic states. For example, each memory cell may be programmed to store one or more logic states (e.g., a logic '0', a logic '1', a logic '00', a logic '01', a logic '10', a logic '11'). The memory cells of the memory dies 235 may use any number of storage technologies to store data including DRAM, FeRAM, phase change memory (PCM), three-dimensional cross-point (3DXP) memory3D XPoint™, NAND Flash, NOR Flash, or a combination thereof. In some cases, a single memory device may include a first memory die that uses a first memory technology (e.g., DRAM) and a second memory die that uses second memory technology (e.g., FeRAM) different from the first memory technology.

In some cases, the memory dies 235 may be an example of two-dimensional (2D) array of memory cells. In some cases, multiple memory dies 235 may be stacked or formed on top of one another to form a three-dimensional (3D) array. In some examples, a memory die may include multiple decks of memory cells stacked or formed on top of one another. Such a configuration may increase the quantity of memory cells that may be formed on a single die or substrate as compared with 2D arrays. In turn, this may reduce production costs, or increase the performance of the memory array, or both. Each level of the array may be positioned so that memory cells across each level may be approximately aligned with one another, forming a memory cell stack. In some cases, the memory dies 235 may be stacked directly on one another. In other cases, one or more of the memory dies 235 may be positioned away from a stack of memory dies (e.g., in different memory stacks).

The memory dies 235 may include one or more vias (e.g., through-silicon vias (TSVs)). In some cases, the one or more vias may be part of internal signal paths that couple controllers with memory cells. The vias may be used to communicate between memory dies 235, for example, when the memory dies are stacked on one another. In some cases, some vias may be used to facilitate communication between a controller of the memory device and at least some of the memory dies 235. In some cases, a single via may be coupled with multiple memory dies 235.

The organic substrate 240 may include the interface for the channels 225. In some cases, the organic substrate 240 may enable the memory device 110-*a* to be a fully tested device before it is coupled with the host device 105-*a*.

Figure 3:
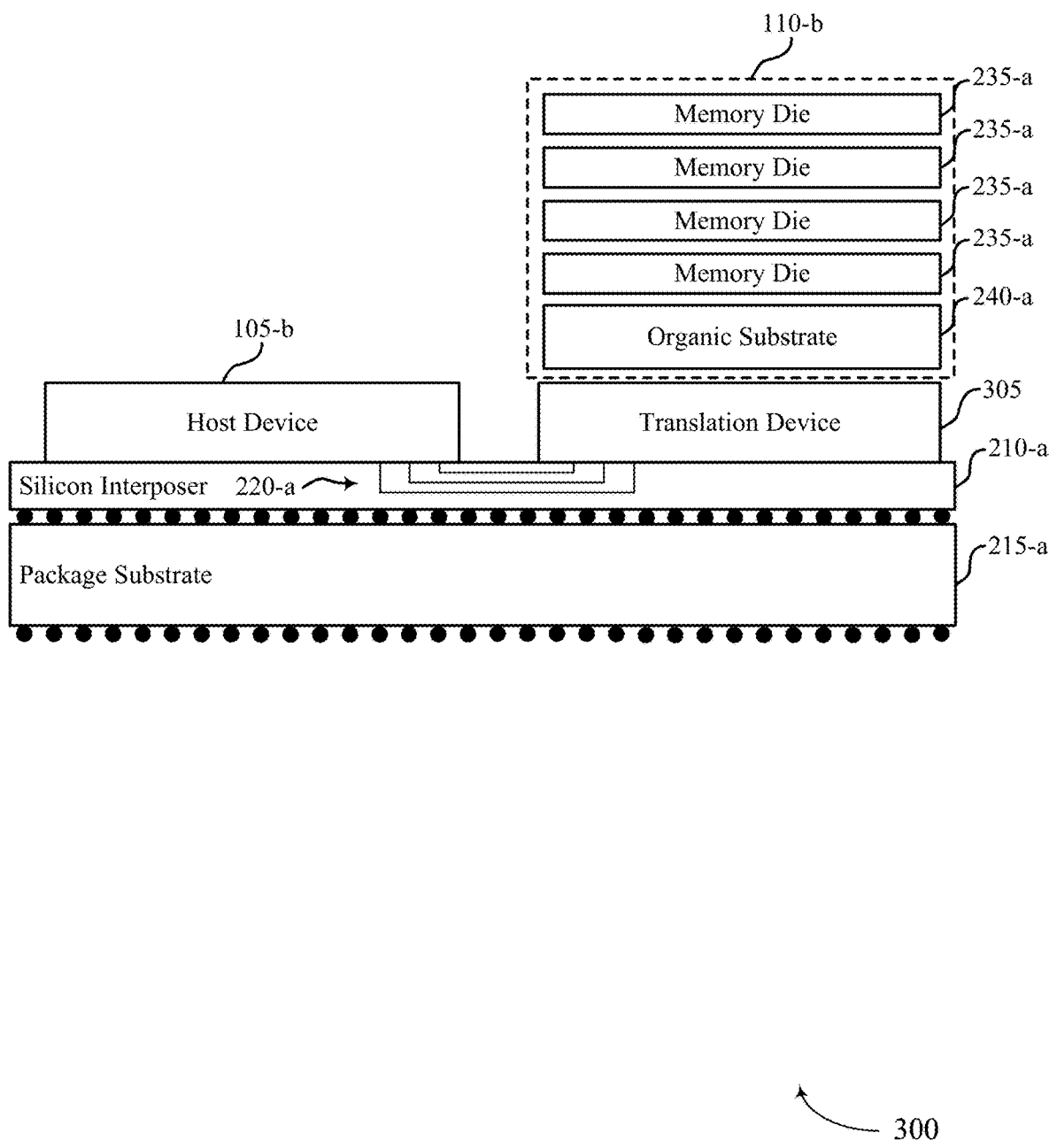
FIG. 3 illustrates an example of a device that supports a translation system for finer grain memory architectures in accordance with embodiments of the present disclosure.

FIG. 3 illustrates an example of a device 300 that supports a translation system for finer grain memory architectures in accordance with various embodiments of the present disclosure. The device 300 may be an example of the devices 100, 200 described with reference to FIGS. 1 and 2. The device 300 may include a translation device 305 configured to enable communications between a host device 105-*b* and a memory device 110-*b* that implements a different memory technology than what is expected by the host device 105-*b*. The translation device 305 may be an example of the translation device 205 or may be differently configured.

A difference between the translation device 305 and the translation device 205 is that the translation device 305 is positioned beneath the memory device 110-*b*. In such cases, the internal routing of channels in the translation device 305 may be different from the translation device 205. For example, an interface with the channels 220-*a* may be positioned on the bottom of the translation device 305 and an interface with the channels 225-*a* (or the interface with the memory device 110-*b* directly) may be positioned on the top of the translation device 305. In some cases, the pin layouts between those two interfaces may be quite different.

The translation device 305 may be positioned on the silicon interposer 210-*a*. As such, channels associated with the translation device 305 may not be routed through the package substrate 215-*a*. In some examples, translation device 305 may be a logic layer of memory device 110-*b* and memory device 110-*b,* including translation device 305, may be affixed within a socket formed on silicon interposer 210-*a*. In some cases, the device 300 may not include any channels of wiring in an organic substrate.

Figure 4:
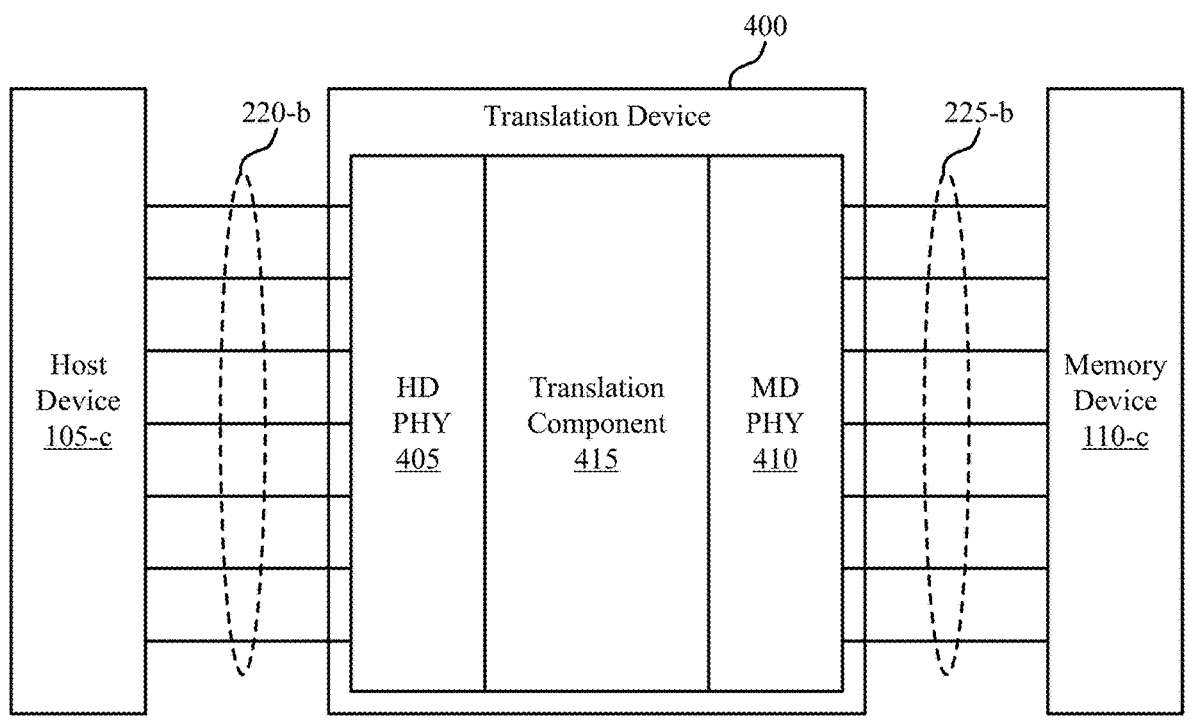
FIG. 4 illustrates an example of a translation device that supports a translation system for finer grain memory architectures in accordance with embodiments of the present disclosure.

FIG. 4 illustrates an example of a translation device 400 that supports a translation system for finer grain memory architectures in accordance with various embodiments of the present disclosure. The translation device 400 may be an example of the translation devices 205 and 305 described with reference to FIGS. 2 and 3. The translation device 400 may be configured to enable communications between a host device 105-*c* and a memory device 110-*c* that implements a different memory technology than what is expected by the host device 105-*c*. The translation device 400 may include a first interface 405 (sometimes called a host device PHY (also referred to "HD PHY")), a second interface 410 (sometimes called a memory device PHY (also referred to "MD PHY")), and a translation component 415.

The HD PHY 405 may include circuitry to interface with the host device 105-*c*. The HD PHY 405 may include a pin layout for one or more channels configured to couple with a pin layout associated with the host device 105-*c*. For example, HD PHY 405 may include a pin layout associated with a first memory technology (e.g., HBM). The HD PHY 405 may be configured to interface with channels formed for wiring in the silicon interfacing, when the translation device 400 is positioned on a silicon interposer. In some cases, the HD PHY 405 may include circuitry configured to use a first communication protocol associated with the host device 105-*c*. The HD PHY 405 may be configured to communicate using at least one of the communication protocols that the host device 105-*c* is capable of using.

The MD PHY 410 may include circuitry required to interface with the memory device 110-*c*. The MD PHY 410 may include a pin layout for one or more channels configured to couple with a pin layout associated with the memory device 110-*c*. For example, MD PHY 410 may include a pin layout associated with a second memory technology (e.g., DRAM, FeRAM, PCM, or other memory technologies). The MD PHY 410 may be configured to interface with channels formed from wiring in the silicon interfacing or channels formed from wiring in the organic substrate.

When the translation device 400 is positioned on a silicon interposer a portion of the channels 225-*b* coupling the translation device 400 with the memory device 110-*c* may extend through the silicon interposer. In some cases, the channels 225-*b* include a least a portion of wiring within the silicon interposer. In some cases, the channels 225-*b* may include wiring within the organic substrate that is tunneled through the silicon interposer. In some cases, the MD PHY 410 may include circuitry configured to use a second communication protocol associated with the memory device 110-*c*. The MD PHY 410 may be configured to communicate using at least one of the communication protocols that the memory device 110-*c* is capable of using.

The translation component 415 may be configured to covert signals received using the HD PHY 405 into signals transmitted using the MD PHY 410 and vice-versa. The translation component 415 may be configured to convert between different communication protocols that are used with the respective PHYs 405, 410. For example, the translation component 415 may be configured to convert between any communication protocol used by the host device 105-*c* (e.g., HBM communication protocol) and any communication protocol used by the memory device 110-*c* (e.g., unique DRAM communication protocol).

When converting between different communication protocols and/or different memory technologies, the translation component 415 may be configured to perform a variety of operations. The translation component 415 may be configured to decode the data received using the first communication protocol (from either the host device 105-*c* or the memory device 110-*c*), encode the data into the second communication protocol, and transmit the data using the second communication protocol (to either the host device 105-*c* or the memory device 110-*c*). The transition between decoding the first communication protocol and encoding using the first communication protocol may include various operations.

In some cases, the translation component 415 may be configured to map commands of the first protocol to commands of the second protocol. The command structure for the first communication protocol may be different from a command structure of the second communication protocol. Further, the bit sequences of similar commands in the first and second communication protocols may be different.

The translation component 415 may be configured to decode the command received using the first communication protocol, identify a similar command in the second communication protocol, and convert the command of the first communication protocol to the identified similar command of the second communication protocol. In some cases, the translation component 415 may identify whether the command of the second communication protocol requires additional information not included in the command of the first communication protocol. The translation component 415 may be configured to identify the missing information by requesting the missing information from the device that transmitted the command using the first protocol and/or the translation component 415 may identify the missing information based on preconfigured data stored in memory somewhere.

In some cases, the translation component 415 may be configured to map a memory address received from the transmitting device (e.g., host device 105-*c* or memory device 110-*c*) to a memory address expected by the receiving device (e.g., host device 105-*c* or memory device 110-*c*). For example, if the host device 105-*c* is configured to couple with and communicate with a memory device that implements a certain memory technology (e.g., HBM, HBM2, GDDR5x, etc.), the host device 105-*c* may be preconfigured with a memory addressing scheme related to that certain memory technology. Whereas, the memory device 110-*c* may use a different address scheme not known to the host device 105-*c*. The translation component 415 may be configured to convert between addressing schemes.

For example, the host device 105-*c* may transmit a read command that includes a memory address for the data that the host device 105-*c* needs. The memory address may include a memory location for an HBM device that the host device 105-*c* expects to be coupled with. In some cases, the host device 105-*c* may identify the memory address to include with the command based on the communication protocol being used to communicate information. The translation component 415 may be configured to convert an address usable by the host device 105-*c* into an address usable by the memory device and vice-versa.

In some cases, the translation component 415 may be configured to map between different channels. For example, the channels 220-*b* coupling the host device 105-*c* with the translation device 400 may have include a first quantity of pins (e.g., channel width), a first operating frequency, and/or a first bandwidth that are different from a second quantity of pins, a second operating frequency, and/or a second bandwidth of the channels 225-*b* coupling the translation device 400 with the memory device 110-*c*. Due to mismatches in channel characteristics, the translation component 415 may be configured to adjust operating frequencies, burst lengths, channel assignments, and other characteristics of the channels. Some specific examples of channel mapping are discussed with reference to FIGS. 6-8.

In some cases, the translation component 415 may be configured to convert the data to a different symbol set based on the communication protocols being used. For example, the first communication protocol may use two-symbol modulation scheme (e.g., non-return to zero (NRZ) modulation scheme) where data is encoded using two symbols to represent one bit of data. The second communication protocol may use a different multi-level modulation scheme (e.g., a M-ary modulation scheme where $M>=3$ such as pulse amplitude modulation (PAM4, PAM8, etc.) scheme). The translation component 415 may be configured to demodulate data using the first modulation scheme and remodulate the data using the second modulation scheme.

The translation component 415 may include circuit and sub-components necessary to perform the functions described herein. In some cases, the translation component 415 may include a processor and/or memory configured to execute commands that convert aspects of a signal receiving using a first communication protocol into a signal transmitted using a different communication protocol.

Figure 5:
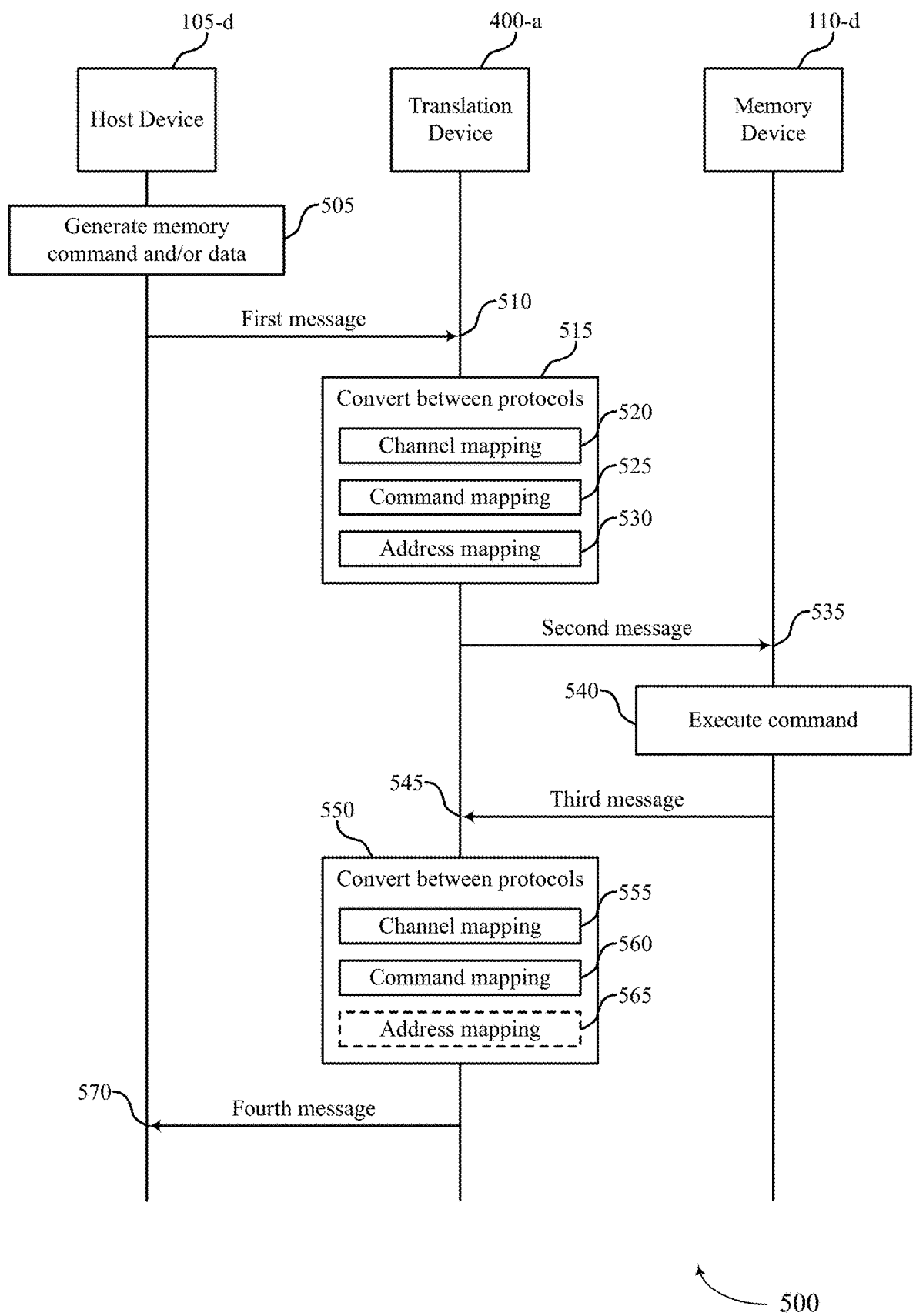
FIG. 5 illustrates an example of a communication scheme that supports a translation system for finer grain memory architectures in accordance with embodiments of the present disclosure.

FIG. 5 illustrates an example of a communication scheme 500 that supports a translation system for finer grain memory architectures in accordance with various embodiments of the present disclosure. The communication scheme 500 illustrates communication between devices and how a device (such as device 100, 200, or 300) so configured to communicate would operate using a translation device. The communication scheme 500 shows functions of and communications between a host device 105-d, a translation device 400-a, and a memory device 110-d. The communication scheme 500 illustrates one example of functions and communication exchanges between these devices. The functions and communications of the communication scheme 500 may be performed in order.

At block 505, the host device 105-d may generate a memory command and/or data to be transmitted to the memory device 110-d. The memory command may be any type of memory command (e.g., a write command, a read command, a reset command, a precharge command, a refresh command). The data may be examples of any data that accompanies the memory command. For example, the data may include a memory address specifying the location of the memory device that should be accessed (either for a read or write operation). The data may also include payload data to be written into the memory device 110-d and stored there.

The host device 105-d may generate a first message 510 by encoding the memory command and/or data using a first communication protocol. The host device 105-d and the memory device 110-d may be configured to talk to each other using one or more communication protocols. The communication protocols may be based on the types of technologies being implemented by the host device 105-d and/or the memory device 110-d. In cases where the host device 105-d is communicating using a first communication protocol and the memory device 110-d is communicating using a second communication protocol, a translation device 400-a may be configured to enable communication between the two device and/or between the two communication protocols.

At block 515, the translation device 400-a may convert the first message 510 from a first communication protocol used by the host device 105-d to a second communication protocol used by the memory device 110-d based on receiving the first message 510. As part of this conversion, the translation device 400-a may perform any quantity of operations. For example, the translation device 400-a may perform a channel mapping operation (block 520), a command mapping operation (block 525), an address mapping operation (block 530), other operations relevant to mapping involving burst lengths, operating frequencies, or other characteristics, or a combination thereof. Many of these operation are described in greater detail with reference to FIG. 4 or FIGS. 6-8.

The translation device 400-a may generate a second message 535 based on the first message 510. The second message 535 may include the same or similar information as the first message 510, except the second message 535 is encoded using the second communication protocol instead of the first communication protocol. The second message 535 may include functionally equivalent information as the first message 510, but the bit values of the second message 535 may be different from the bit values of the first message 510 because a different communication protocol is used to communicate the information.

At block 540, the memory device 110-d may execute the command included in the second message 535. For example, if the second message 535 included a read command from the host device 105-d, the memory device 110-d may access the memory cells located at the location indicated by the memory address in the second message and retrieve the data stored there. In such an example, the memory device 110-d may generate a third message 545 using the second communication protocol to transmit the requested data back to the host device 105-d. The host device 105-d may not be capable of decoding the third message.

At block 550, the translation device 400-a may convert the third message 545 from the second communication protocol used by the memory device 110-d to the first communication protocol used by the host device 105-d based on receiving the third message 545. As part of this conversion, the translation device 400-a may perform any quantity of operations. For example, the translation device 400-a may perform a channel mapping operation (block 555), a command mapping operation (block 560), an address mapping operation (block 565), other operations relevant to mapping involving burst lengths, operating frequencies, or other characteristics, or a combination thereof. Many of these operation are described in greater detail with reference to FIG. 4 or FIGS. 6-8.

The conversion operations for going from the first communication protocol to the second communication protocol may be different from the conversion operation for going from the second communication protocol to the first communication protocol. The information communicated from a host device 105-d to a memory device 110-d may be different from the information communicate from the memory device 110-d to the host device 105-d. For example, during a read operation, the host device 105-d may communicate a read command and a memory address in the first message 510, whereas the memory device 110-d may communicate the requested data in the third message 545. In such a scenario, the translation device 400-a may not need to perform address mapping on the third message. However, the translation device 400-a may need to perform other operations, such as converting between modulation schemes.

The translation device 400-a may generate a fourth message 570 based on the third message 545. The fourth message 570 may include the same or similar information as the third message 545, except the fourth message 570 is encoded using the second communication protocol instead of the first communication protocol. The fourth message 570 may include functionally equivalent information as the third message 545, but the bit values of the fourth message 570 may be different from the bit values of the third message 545 because a different communication protocol is used to communicate the information.

Figure 6:
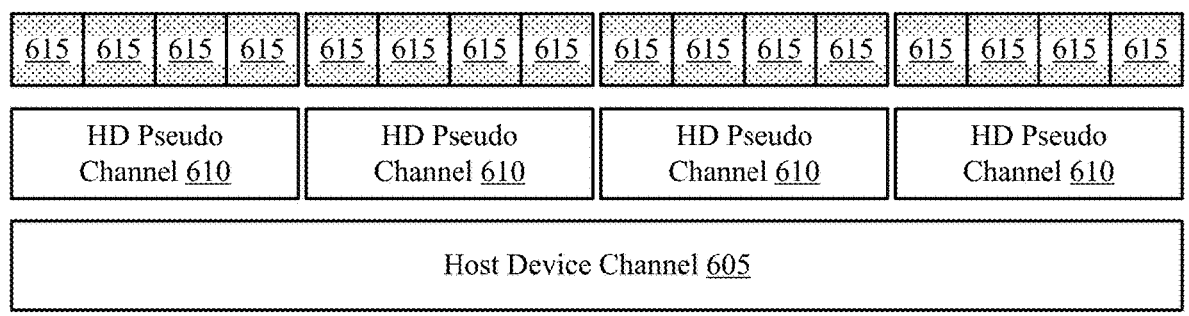
FIG. 6 illustrates an example of a channel mapping that supports a translation system for finer grain memory architectures in accordance with embodiments of the present disclosure.

FIG. 6 illustrates an example of a channel mapping 600 that supports a translation system for finer grain memory architectures in accordance with various embodiments of the present disclosure. The channels (e.g., channels 220) used by the host device 105 to communicate may be configured differently than the channels (e.g., channels 225) used by the memory device 110 to communicate. The translation device (e.g., translation device 400) may be configured to modify data between the different channel structures. For example, the translation device 400 may be configured to partition and/or combine data in various ways to facilitate communication between the host device 105 and the memory device 110. In the illustrative example of FIG. 6, the memory device 110 has more numerous smaller channels than the host device 105. In some examples, any combination of channel sizes may be handled by the translation device 400.

The channel mapping 600 includes a host device channel 605, a plurality of host device pseudo channels 610, and a plurality of memory device channels 615. The channel mapping 600 illustrates a mapping of a single host device channel. In other cases, however, the operations and functions described herein may be applied to a plurality of channels in a variety of different ways.

The host device channel 605 may be an example of the channels 220 described with reference to FIGS. 3 and 4. The host device channel 605 may be an example of an HBM channel. The host device channel 605 may have a channel width of a 144 pins. The host device channel 605 may be configured to operate at an operating frequency of 4 Gb/s. In such cases, a burst length of the channel may be equal to about 2 nanoseconds (ns). In some cases, the host device channel 605 may be configured to operate at an operating frequency of 6 Gb/s and the burst length may be equal to about 1.33 ns.

The memory device channels 615 may be examples of the channels 225 described with reference to FIG. 3. The memory device channel 615 may be an example of the channels described with reference to FIG. 12. A single memory device channel 615 may have a channel width of four pins. The memory device channel 615 may be configured to operate at an operating frequency of 16 Gb/s and the burst length may be equal to about 4.5 ns. In some cases, the memory device channel 615 may be configured with any length of burst length. For example, the burst length of the memory device channel 615 may be about 1 ns, 1.5 ns, 2 ns, 2.5 ns, 3 ns, 3.5 ns, 4 ns, 4.5 ns, 5 ns, 5.5 ns, 6 ns, 6.5 ns, 7 ns, etc. A memory device channel 615 may be have a lower bandwidth than the host device channel 605, but this affect may be compensated by having additional memory device channels 615. In some examples, the memory device 110 includes 128 memory device channels and the host device 105 includes 8 host device channels 605 and 32 host device pseudo channels 610. In some cases, the memory device channels 615 may communicate signals modulated using PAM4, PAM8, or some other M-ary modulation scheme where M>=3.

Figure 7:
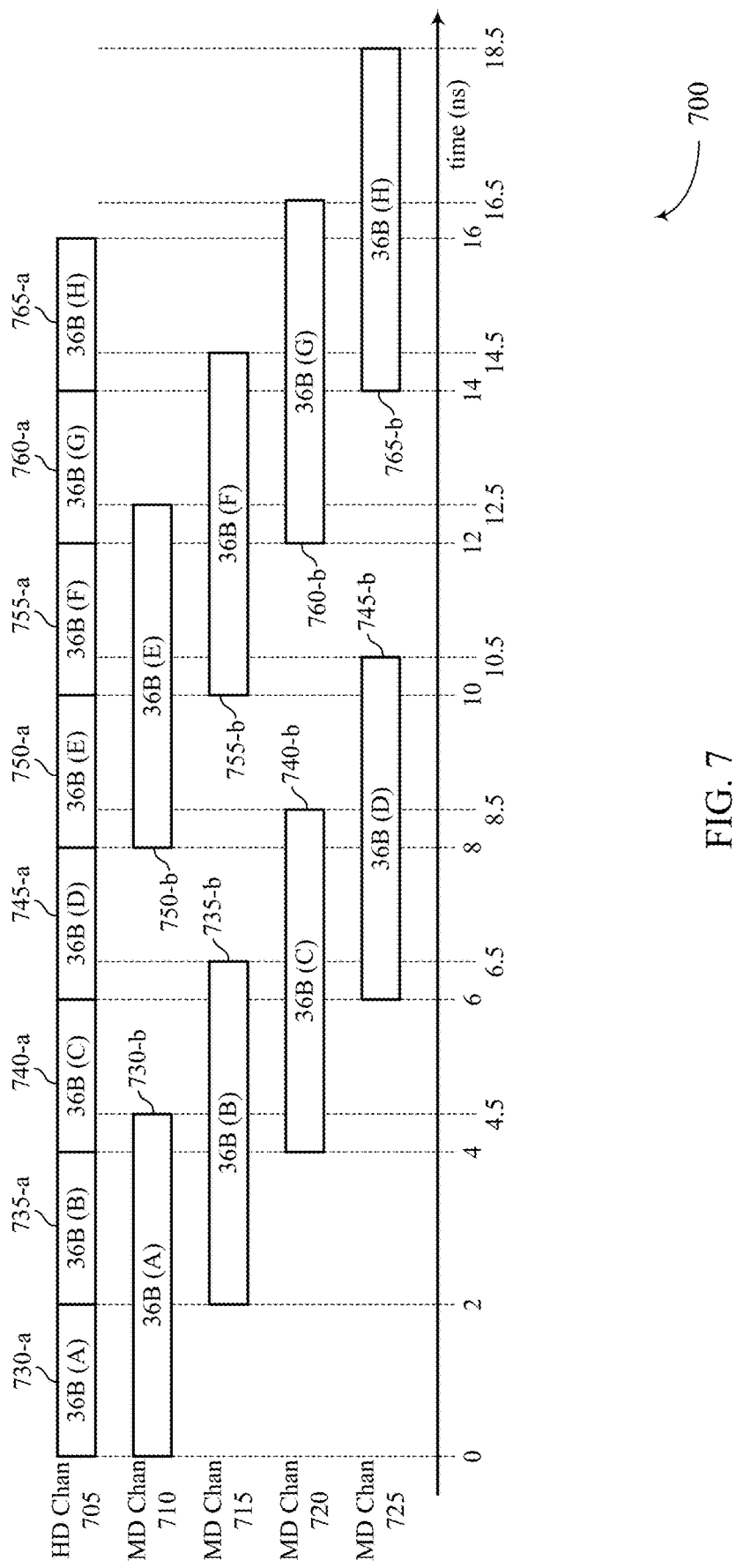
FIG. 7 illustrates an example of timing diagram that supports a translation system for finer grain memory architectures in accordance with embodiments of the present disclosure.
Figure 8:
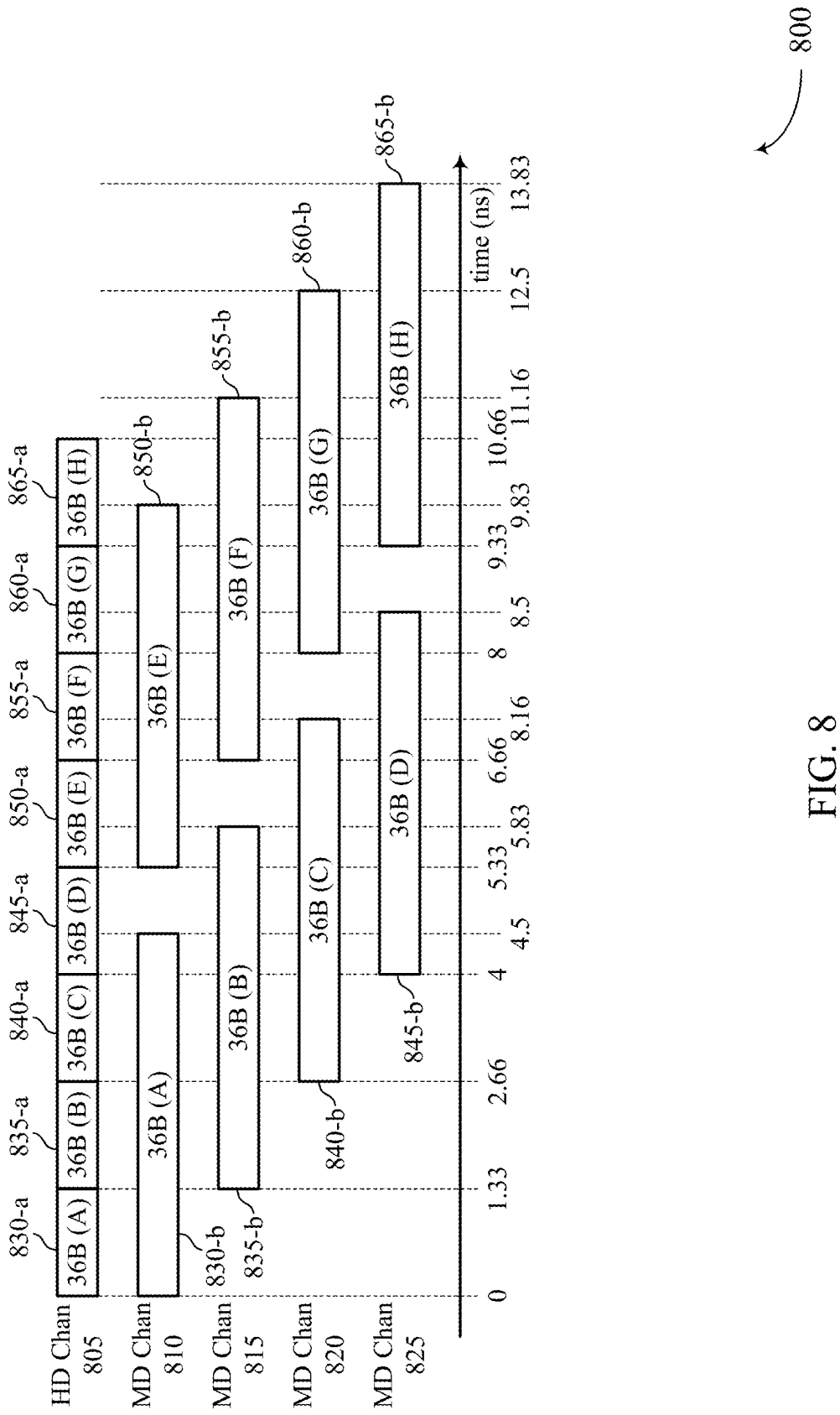
FIG. 8 illustrates an example of timing diagram that supports a translation system for finer grain memory architectures in accordance with embodiments of the present disclosure.

In some cases, the translation device 400 may be configured to map the host device channels 605 of the host device 105 to the memory device channels 615 of the memory device 110. In some cases, the translation device 400 may partition the wider channel (in this case the host device channel 605) in the plurality of host device pseudo channels 610 before mapping to the narrower channels (in this case the memory device channel 615). FIGS. 7-8 show examples of techniques for mapping data between different channels with widths and characteristics.

FIG. 7 illustrates an example of a timing diagram 700 showing a technique for channel mapping by a translation device that supports a translation system for finer grain memory architectures in accordance with various embodiments of the present disclosure. The timing diagram 700 illustrates how discrete chunks of data transmitted over a wide channel can be partitioned and distributed to a plurality of narrower channels. A person of ordinary skill in the art would appreciate how data from narrower channels may be combined to be transmitted over a wide channel using the principles described herein.

The timing diagram 700 shows a host device channel 705 (e.g., a host device pseudo channel 610 comprising 36 data pins) mapped to four memory device channels 710-725 (e.g., memory device channels 615 each comprising four data pins). The host device channel 705 may be operating in a normal mode at 4 Gb/s. Data communicated across the host device channel 705 is divided into portions 730-765. Those portions may be distributed to one or more of the memory device channels 710-725 in a manner to minimize latency caused by the channel mapping.

When operating at a particular operating frequency (e.g., 4 Gb/s), a portion 730-*a* of data may be received across the host device channel 705 every two ns. Because the memory device channels 710-725 have a different width than the host device channel 705 and a different operating frequency, the same portion 730-*b* may take 4.5 ns to be transmitted across the memory device channel 710. Because the burst length of the portion 730-*b* may span across multiple burst lengths of the host device channel (e.g., portions 730-*a*, 735-*a*, and 740-*a*), multiple memory device channels 710-725 may be needed to minimize latency caused by channel mapping. In some cases, the memory device channels 710-725 may be configured with any length of burst length. For example, the burst length of the memory device channels 710-725 may be about 1 ns, 1.5 ns, 2 ns, 2.5 ns, 3 ns, 3.5 ns, 4 ns, 4.5 ns, 5 ns, 5.5 ns, 6 ns, 6.5 ns, 7 ns, etc.

In some cases, a translation device 400 may receive a portion 730-*a* across the host device channel 705 and may assign a converted portion 730-*b* to a single memory device channel 710. In such cases, the translation device 400 may cycle through assigning converted portions 730-*b*-745-*b* to the next available memory channel. At some point in time, the original memory device channel 710 will complete its assigned transmission (portion 730-*b*) and will be become available again. The translation device 400 may then assign a new portion 750-*b* to the newly available memory device channel 710. In this manner, a single wide channel (e.g., host device channel 705) may be mapped to a finite quantity of narrower channels (e.g., memory device channels 710-725).

It should be appreciated that changes in the operating frequency of either channel, the burst length of either channel, and/or width of either channel may alter the channel mapping mechanisms. For example, in different examples, a different quantity of narrower channels may be used (e.g., two, three, four, five, six, seven, or eight channels) for a single wider channel.

In some cases, a translation device 400 may partition a portion 730-*a* into a plurality of sub-portions and assign each sub-portion to a different memory device channel 710-725. In effect, the translation device 400 may parallelize the translation of the portion 730-*b* across multiple channels.

In some cases, the new portions 730-*b*-765-*b* may be transmitted with a delay as compared to the receiving time of the original data 730-*a*-765-*a*. For example, the translation device 400 may first receive the entire portion 730-*a* of data. The translation device 400 may then perform conversion operations on the portion 730-*a* of data (e.g., decode operation, address conversion operation, channel conversion operation, command conversion operation, encode operation, modulation operation). The translation device 400 may transmit the portion 730-*b* after these operations are complete, or are at least partially complete. In such examples, the portion 730-*b* may not begin being transmitted until after the two ns mark.

FIG. 8 illustrates an example of a timing diagram 800 showing a technique for channel mapping by a translation device that supports a translation system for finer grain memory architectures in accordance with various embodiments of the present disclosure. The timing diagram 800 uses many of the same principles as the timing diagram 700 except that that the host device channel 805 may be operating in an enhanced mode. An enhanced mode of the host device channel 805 may include operating an operating frequency that exceeds normal bounds of the host device 105 (e.g., similar to overclocking a processor).

In some examples, the enhanced mode may include operating at an operating frequency of the host device channel 805 has been increased to 6 Gb/s, thereby shortening the burst length to 1.33 ns for a portion of data (e.g., portions 830-a-865-a). Such an operating system may beyond the normal specifications of the host device. For example, if the host device channel 805 is an HBM channel, 6 Gb/s may be beyond its normal specifications. An enhanced mode may include at operating at any operating characteristic that exceeds the normal specification. Operating one of the devices in an enhanced mode may decrease the total time for communicating data using the translation device. The data received across the host device channel 805 may be mapped to four memory device channels 810-825 having burst lengths of 4.5 ns (e.g., see the portions 830-b-865-b). In some cases, the memory device channels 810-825 may be configured with any length of burst length. For example, the burst length of the memory device channels 810-825 may be about 1 ns, 1.5 ns, 2 ns, 2.5 ns, 3 ns, 3.5 ns, 4 ns, 4.5 ns, 5 ns, 5.5 ns, 6 ns, 6.5 ns, 7 ns, etc.

In some cases, additional narrow channels may be needed to support communication across the wider channel. For example, if the burst length of the host device channel 805 dropped to less than 1 ns, five memory device channels may be needed to communicate the portions 830-b-865-b of data.

Figure 9:
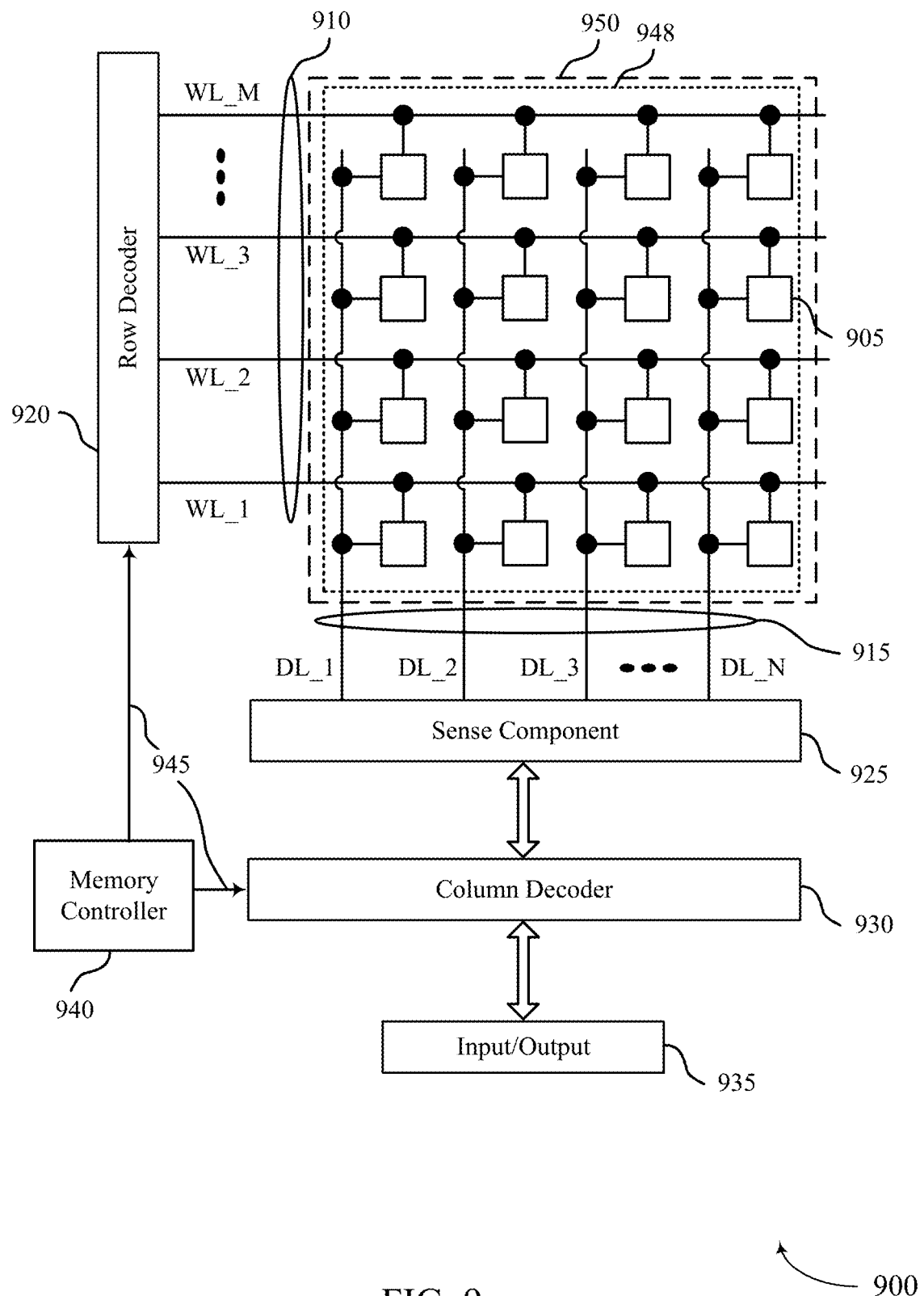
FIG. 9 illustrates an example of a memory die that supports a translation system for finer grain memory architectures in accordance with embodiments of the present disclosure.

FIG. 9 illustrates an example memory die 900 in accordance with various aspects of the present disclosure. The memory die 900 may be an example of a memory die 235 of the memory device 110 described with reference to FIG. 2. Memory die 900 may also be referred to as an electronic memory apparatus, a memory array, an array of memory cells, or a deck of memory cells, in some examples. Memory array 948 includes memory cells 905 that are programmable to store different states. Memory cells 905 may be arranged in one or more banks of memory cells that may be independently accessible. Each memory cell 905 may be programmable to store two states, denoted as a logic 0 and a logic 1. In some cases, memory cell 905 is configured to store more than two logic states.

A memory cell 905 may store a charge representative of the programmable states in a capacitor; for example, a charged and uncharged capacitor may represent two logic states, respectively. DRAM architectures may use such a design, and the capacitor employed may include a dielectric material with linear or para-electric electric polarization properties as the insulator. FeRAM architectures may also employ such a design.

Operations such as reading and writing may be performed on memory cells 905 by activating access line 910 and digit line 915. Access lines 910 may also be known as word lines 910, and bit lines 915 may also be known digit lines 915. References to word lines and bit lines, or their analogues, are interchangeable without loss of understanding or operation. Activating a word line 910 or a digit line 915 may include applying a voltage to the respective line. Word lines 910 and digit lines 915 may be made of conductive materials such as metals (e.g., copper (Cu), aluminum (Al), gold (Au), tungsten (W), etc.), metal alloys, carbon, conductively-doped semiconductors, or other conductive materials, alloys, compounds, or the like.

According to the example of FIG. 9, each row of memory cells 905 is connected to a single word line 910, and each column of memory cells 905 is connected to a single digit line 915. By activating one word line 910 and one digit line 915 (e.g., applying a voltage to the word line 910 or digit line 915), a single memory cell 905 may be accessed at their intersection. Accessing the memory cell 905 may include reading or writing the memory cell 905. The intersection of a word line 910 and digit line 915 may be referred to as an address of a memory cell. Additionally or alternatively, for example, each row of memory cells 905 may be arranged in one or more banks of memory cells.

In some architectures, the logic storing device of a cell, e.g., a capacitor, may be electrically isolated from the digit line by a selection component (not shown). The word line 910 may be connected to and may control the selection component. For example, the selection component may be a transistor and the word line 910 may be connected to the gate of the transistor. Activating the word line 910 results in an electrical connection or closed circuit between the capacitor of a memory cell 905 and its corresponding digit line 915. The digit line may then be accessed to either read or write the memory cell 905.

Accessing memory cells 905 may be controlled through a row decoder 920 and a column decoder 930. For example, a row decoder 920 may receive a row address from the memory controller 940 and activate the appropriate word line 910 based on the received row address. Similarly, a column decoder 930 receives a column address from the memory controller 940 and activates the appropriate digit line 915. Row decoder 120 and column decoder 130 may receive a row address and a column address, respectively, for a memory cell located within one specific bank of memory cells. Additionally or alternatively, each bank of memory cells may be in electronic communication with a separate row decoder 120 and column decoder 130. For example, memory die 900 may include multiple word lines 910, labeled WL_1 through WL_M, and multiple digit lines 915, labeled DL_1 through DL_N, where M and N depend on the array size. Thus, by activating a word line 910 and a digit line 915, e.g., WL_2 and DL_3, the memory cell 905 at their intersection may be accessed.

Upon accessing a memory cell 905, the cell may be read, or sensed, by sense component 925 to determine the stored state of the memory cell 905. For example, after accessing the memory cell 905, the capacitor of memory cell 905 may discharge onto its corresponding digit line 915. Discharging the capacitor may result from biasing, or applying a voltage, to the capacitor. The discharging may cause a change in the voltage of the digit line 915, which sense component 925 may compare to a reference voltage (not shown) in order to determine the stored state of the memory cell 905. For example, if digit line 915 has a higher voltage than the reference voltage, then sense component 925 may determine that the stored state in memory cell 905 was a logic 1 and vice versa. Sense component 925 may include various transistors or amplifiers in order to detect and amplify a difference in the signals, which may be referred to as latching. The detected logic state of memory cell 905 may then be output through column decoder 930 as output 935. In some cases, sense component 925 may be part of a column decoder 930 or row decoder 920. Or, sense component 925 may be connected to or in electronic communication with column decoder 930 or row decoder 920.

A memory cell 905 may be set, or written, by similarly activating the relevant word line 910 and digit line 915—i.e., a logic value may be stored in the memory cell 905. Column decoder 930 or row decoder 920 may accept data, for example input/output 935, to be written to the memory cells 905. A memory cell 905 may be written by applying a voltage across the capacitor. This process is discussed in more detail below.

The memory controller 940 may control the operation (e.g., read, write, re-write, refresh, discharge, etc.) of memory cells 905 through the various components, for example, row decoder 920, column decoder 930, and sense component 925. Memory controller 140 may be a component of memory die 900 or may be external to memory die 900 in various examples. In some cases, one or more of the row decoder 920, column decoder 930, and sense component 925 may be co-located with the memory controller 940. Memory controller 940 may generate row and column address signals in order to activate the desired word line 910 and digit line 915. The memory controller 140 may activate the desired word line 910 and digit line 115 of a specific bank of memory cells via at least one channel traversing the array 148. Memory controller 940 may also generate and control various voltages or currents used during the operation of memory die 900. For example, it may apply discharge voltages to a word line 910 or digit line 915 after accessing one or more memory cells 905. Memory controller 940 may be coupled to memory cells 905 via channels 945. Channels 945 are illustrated in FIG. 1 as logical connections with row decoder 920 and column decoder 930, but those skilled in the art will recognize that other configurations may be employed. As described herein, memory controller 940 may exchange data (e.g., from a read or write operation) with cells 905 multiple times per clock cycle. Memory controller 940 may be implemented in hardware, firmware, or software, or some combination thereof. Memory controller 940 may be integral to or remote from logic associated with memory die 900. In some examples, memory controller 940 is a component or module of a host device or SoC.

Memory die 900 may include memory array 948, which may overlie a CMOS area, such as CMOS under array (CuA) 950. Memory array 948 may include memory cells 905 that are connected to word lines 910 and digit lines 915. The CuA 950 may underlie the memory array 948 and include support circuitry. CuA 950 may underlie the row decoder 920, sense component 925, column decoder 930, and/or memory controller 940. Or CuA 950 may include one or more of row decoder 920, sense component 925, column decoder 930, and memory controller 940. The support circuitry may support one or more additional arrays of memory cells present in a stacked configuration. In a stacked configuration, CuA 950 may facilitate accessing one or more memory cells in each array. For example, CuA 950 may facilitate the transfer of data between a memory cell coupled to a channel of memory array 948, a memory cell coupled to a channel of an additional array that is coupled to memory array 948, and the controller.

In general, the amplitude, shape, or duration of an applied voltage or current discussed herein may be adjusted or varied and may be different for the various operations discussed in operating the memory die 900. Further, one, multiple, or all memory cells 905 within memory die 900 may be accessed simultaneously; for example, multiple or all cells of memory die 900 may be accessed simultaneously during a reset operation in which all memory cells 905, or a group of memory cells 905, are set to a single logic state.

In one example, a system may include a host device, a memory device that comprises one or more arrays of memory cells configured to write data from or read data to the host device, and a translation device coupled with the host device and the memory device, the translation device configured to communicate with the host device using a first communication protocol and to communicate with the memory device using a second communication protocol different than the first communication protocol.

In some examples, the system may include a silicon interposer coupled with the host device and the translation device, the silicon interposer being positioned between the translation device and a package substrate. In some examples, the system may include a first organic substrate coupled with the memory device, a silicon interposer coupled with the host device, and a second organic substrate coupled with the silicon interposer and the first organic substrate.

In some examples, the system may include a first plurality of channels extending between the host device and the translation device and configured to communicate signals between the host device and the translation device using the first communication protocol, and a second plurality of channels extending between the translation device and the memory device and configured to communicate signals between the translation device and the memory device using the second communication protocol.

In some examples of the system the first plurality of channels is configured for a first operating frequency and the second plurality of channels is configured for a second operating frequency different than the first operating frequency.

In some examples of the system, the first plurality of channels comprise wiring within a silicon interposer. In some examples of the system, the second plurality of channels comprise wiring within an organic substrate. In some examples of the system, a portion of at least one channel of the second plurality of channels extends through a silicon interposer. In some examples of the system, a quantity of the first plurality of channels is less than a quantity of the second plurality of channels. In some examples of the system, the second plurality of channels extend from the translation device, through a silicon interposer, through an organic substrate positioned beneath the silicon interposer, and to the memory device.

In some examples of the system, a portion of at least one channel of the second plurality of channels comprises wiring within a silicon interposer. In some examples of the system, the first communication protocol is a communication protocol for high bandwidth memory (HBM) configured to be communicated across a silicon interposer. In some examples of the system, the memory device includes an organic substrate that is coupled with a package substrate.

In one example, a device may include a first interface in electronic communication with a host device over a silicon interposer, the first interface configured to communicate with the host device using a first communication protocol, a second interface in electronic communication with a memory device using a second communication protocol different than the first communication protocol, and a translation component configured to receive signaling according to the first communication protocol and transmit signaling according to the second communication protocol.

In some examples of the device, the translation component is configured to receive signaling according to the second communication protocol and transmit signaling according to the first communication protocol.

In some examples of the device, the first interface is configured to couple with a first plurality of channels formed using silicon interposer wiring, and the second interface is configured to couple with a second plurality of channels formed using organic substrate wiring, the second plurality of channels being different than from the first plurality of channels. In some examples of the device, the first communication protocol is a communication protocol for high bandwidth memory (HBM) configured to be communicated across the silicon interposer. In some examples of the device, the first interface comprises an HBM physical layer (PHY).

In some examples of the device, the first interface comprises a physical layer (PHY) configured to support pulse amplitude modulation (PAM). In some examples of the device, the translation component is configured to convert signaling between the first communication protocol and the second communication protocol based at least in part on the host device being configured to communicate using the first communication protocol and the memory device being configured to communicate using the second communication protocol.

In one example, a system may include a host device, a memory device that comprises an array of memory cells configured to write data from or read data to the host device, a translation device coupled with the host device and the memory device, a first plurality of channels extending between the host device and the translation device and configured to communicate signals between the host device and the translation device using a first communication protocol, and a second plurality of channels extending between the translation device and the memory device and configured to communicate signals between the translation device and the memory device using a second communication protocol different than the first communication protocol.

Figure 10:
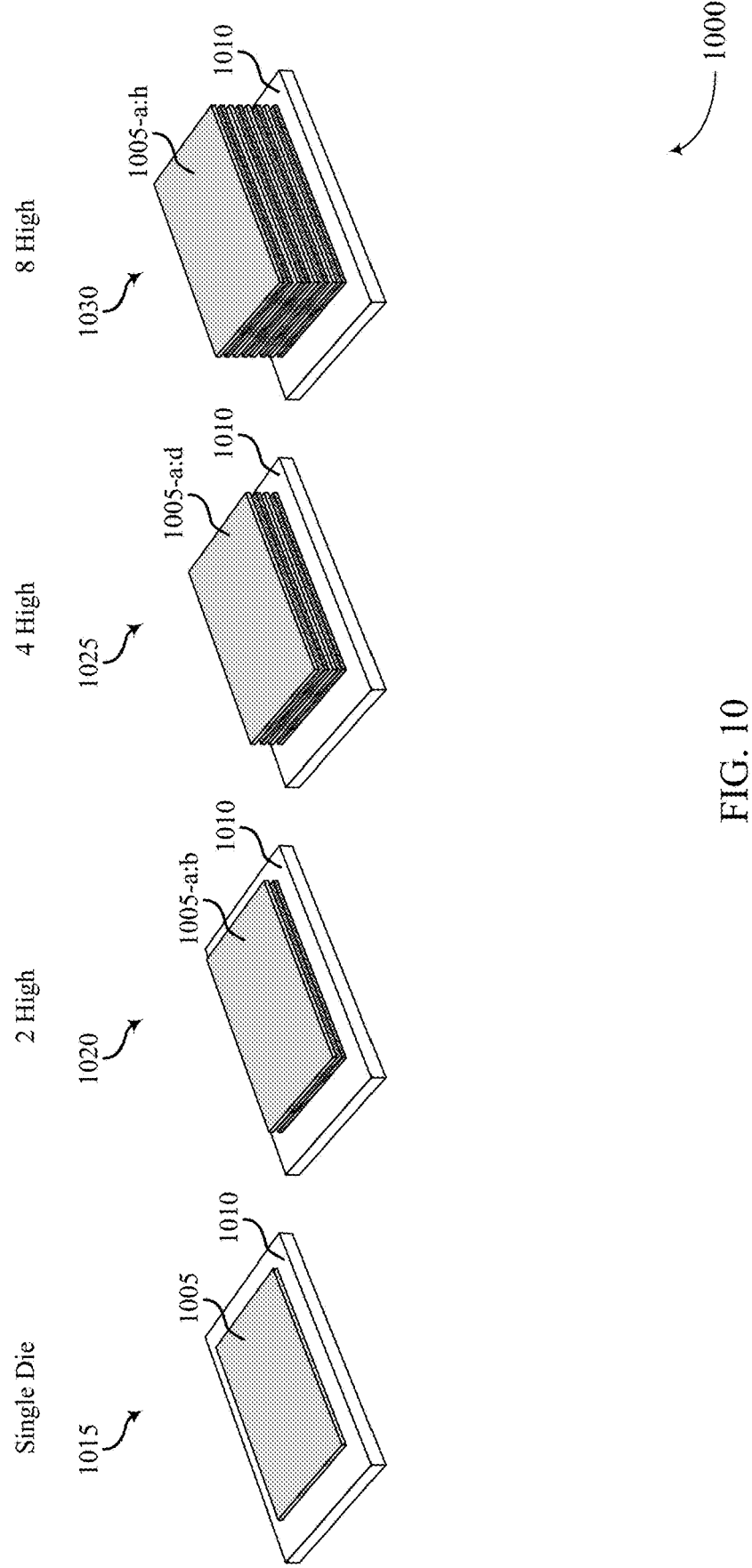
FIG. 10 illustrates an example of a device that supports a translation system for finer grain memory architectures in accordance with embodiments of the present disclosure.

FIG. 10 illustrates an example of a device 1000 that supports a translation system for finer grain memory architectures in accordance with various embodiments of the present disclosure. The memory devices 1000 include at least one memory die 1005 and substrate 1010. The memory devices 1000 may be examples of the memory device 110 described with reference to FIGS. 1-5.

The memory die 1005 may include a plurality of memory cells (as shown in and described with reference to FIG. 1) that may be programmable to store different logic states. For example, each memory cell may be programmed to store one or more logic states (e.g., a logic '0', a logic '1', a logic '00', a logic '01', a logic '10', a logic '11'). The memory cells of the memory dies 1005 may use any number of storage technologies to store data including DRAM, FeRAM, phase change memory (PCM), 3D XPoint™, NAND Flash, NOR Flash, or a combination thereof. In some cases, a single memory device may include a first memory die that uses a first memory technology (e.g., DRAM) and a second memory die that uses second memory technology (e.g., FeRAM) different from the first memory technology.

In some cases, the memory dies 1005 may be an example of two-dimensional (2D) array of memory cells. In some cases, multiple memory dies 1005 may be stacked on top of one another to form a three-dimensional (3D) array. In some examples, a memory die may include multiple decks of memory cells stacked on top of one another. Such a configuration may increase the quantity of memory cells that may be formed on a single die or substrate as compared with 2D arrays. In turn, this may reduce production costs, or increase the performance of the memory array, or both. Each level of the array may be positioned so that memory cells across each level may be approximately aligned with one another, forming a memory cell stack. In some cases, the memory dies 1005 may be stacked directly on one another.

In other cases, one or more of the memory dies 1005 may be positioned away from a stack of memory dies (e.g., in different memory stacks).

For example, a first memory device 1015 may be an example of a single die package that includes a single memory die 1005 and a substrate 1010. A second memory device 1020 may be an example of a two-high device that includes two memory dies 1005-*a:b* and a substrate 1010. A third memory device 1025 may be an example of a four-high device that includes four memory dies 1005-*a:d* and a substrate 1010. A fourth memory device 1030 may be an example of an eight-high device that includes eight memory dies 1005-*a:h* and a substrate 1010. A memory device 1000 may include any quantity of memory dies 1005 stacked on top of a common interposer (e.g., a common substrate). The dies are shown as different shadings to more clearly demonstrate the different layers. In some cases, the memory dies in different layers may be configured similarly as adjacent dies in the memory device.

The memory dies 1005 may include one or more vias (e.g., through-silicon vias (TSVs)). In some cases, the one or more vias may be part of internal signal paths that couple controllers with memory cells. The vias may be used to communicate between memory dies 1005, for example, when the memory dies 900 are stacked on one another. In some cases, some vias may be used to facilitate communication between a controller of the memory device and at least some of the memory dies 1005. In some cases, a single via may be coupled with multiple memory dies 1005.

The substrate 1010 may be configured to couple the memory dies 1005 with a host device (not shown in FIG. 10). The substrate 1010 may be formed of different types of materials. For example, the type of the substrate 1010 may be an organic substrate. In other examples, the type of the substrate 1010 may be a silicon substrate such as a silicon interposer.

Figure 11:
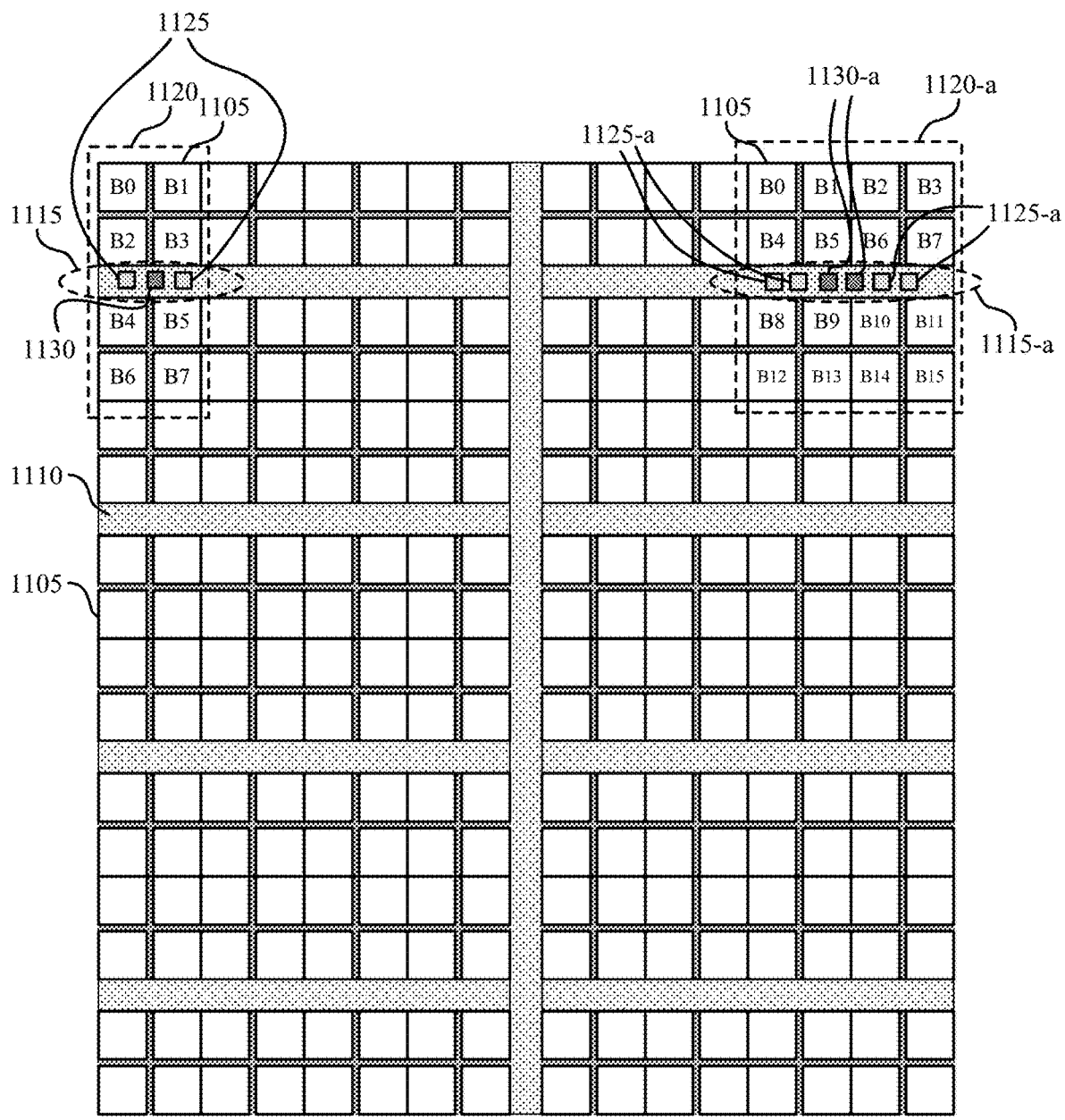
FIG. 11 illustrates an example of a memory die that supports a translation system for finer grain memory architectures in accordance with embodiments of the present disclosure.

FIG. 11 illustrates an example of a memory die 1100 that supports a translation system for finer grain memory architectures in accordance with various embodiments of the present disclosure. The memory die 1100 may be an example of a memory dies 235, 900, 1005 described with reference to FIGS. 2, 9, and 10. In some cases, the memory die 1100 may be referred to as a memory array, an array of memory cells, or a deck of memory cells. The various components of the memory die 1100 may be configured to facilitate high bandwidth data transfer between the host device and a memory device with which the memory die 1100 is associated.

The memory die 1100 may include a plurality of banks 1105 of memory cells (as represented by the white boxes), a plurality of input/output (I/O) channels 1110 (sometimes referred to as I/O regions) traversing the memory cells of the memory die 1100, and a plurality of data channels 1115 that couple the memory die 1100 with the host device. Each of the banks 1105 of memory cells include a plurality of memory cells configured to store data. The memory cells may be DRAM memory cells, FeRAM memory cells, PCM memory cells, or other types of memory cells described herein. The plurality of I/O channels 1110 may include a plurality of power pins and ground pins configured to couple the memory cells of the memory die 1100 with power and ground.

The memory die 1100 may be divided into cell regions 1120 associated with different data channels 1115. For example, a single data channel 1115 may be configured to couple a single cell region 1120 to the host device. The pins of the I/O channel may be configured to couple multiple cell regions 1120 of the memory die 1100 to power, ground, virtual ground, and/or other supporting components.

To provide a high throughput of data (e.g., multiple TB/s) between a host device (not shown) and the memory die 1100, a path length between any given memory cell and the host interface may be shortened, as compared to previous solutions. In addition, shortening the data path between any given memory cell and the host device may also reduce the power consumed during an access operation (e.g., read operation or write operation) of that given memory cell. A number of different architectures and/or strategies may be employed to reduce the size of the data path.

In some examples, the memory die 1100 may be partitioned into a plurality of cell regions 1120. Each cell region 1120 may be associated with a data channel 1115. Two different types of cell region 1120 are illustrated, but the entire memory die 1100 may be populated with any quantity of cell regions 1120 having any shape. A cell region 1120 may include a plurality of banks 1105 of memory cells. There may be any quantity of banks 1105 in a cell region 1120. For example, the memory die 1100 illustrates a first cell region 1120 that includes eight banks 1105 and a second cell region 1120-a that includes sixteen banks 1105-a. Other quantities of banks in the cell region are possible, however (e.g., two, three, four, five, six, seven, eight, nine, ten, eleven, twelve, thirteen, fourteen, fifteen, sixteen, seventeen, eighteen, nineteen, twenty, twenty-one, twenty-two, twenty-three, twenty-four, twenty-five, twenty-six, twenty-seven, twenty-eight, twenty-nine, thirty, thirty-one, thirty-two, etc.). The size of the cell region 1120 may be selected based on the bandwidth requirements of the host device, the power requirements of the host device or the memory device, the size of the data channel, the type of interposer used to couple the memory die 1100 with the host device, a data rate associated with the data channel, other considerations, or combinations thereof. In some cases, the memory die 1100 may be partitioned such that each cell region 1120 is the same size. In other cases, the memory die 1100 may be partitioned such that the memory die 1100 has cell regions 1120 of different sizes.

A data channel 1115 (associated with a cell region) may include a quantity of pins for coupling the memory cells of the cell region 1120 with the host device. At least a portion of the data channel 1115 may comprise channels of the interposer. The data channel 1115 may include a data width specifying how many data pins 1125 (sometimes referenced as DQ pins) are in the data channel 1115. For example, a data channel may have a channel width of two data pins (e.g., X2 channel), four data pins (e.g., X4 channel), eight data pins (e.g., X8 channel), sixteen data pins (e.g., X16 channel), etc. The data channel may also include at least one command/address (C/A) pin 1130. Each memory cell in the cell region 1120 may be configured to transfer data to and from the host device using the pins 1125, 1130 associated with the cell region 1120. The data channel 1115 may also include a clock pin (e.g., CLK) and/or a register clock pin (RCLK).

In some cases, the I/O channel 1110 may bisect the banks 1105 of memory cells in the cell region 1120. In this manner, the data path for any individual memory cell may be shortened. The C/A pin 1130 may be configured to communicate command frames between the memory die 1100 and the host device.

Figure 12:
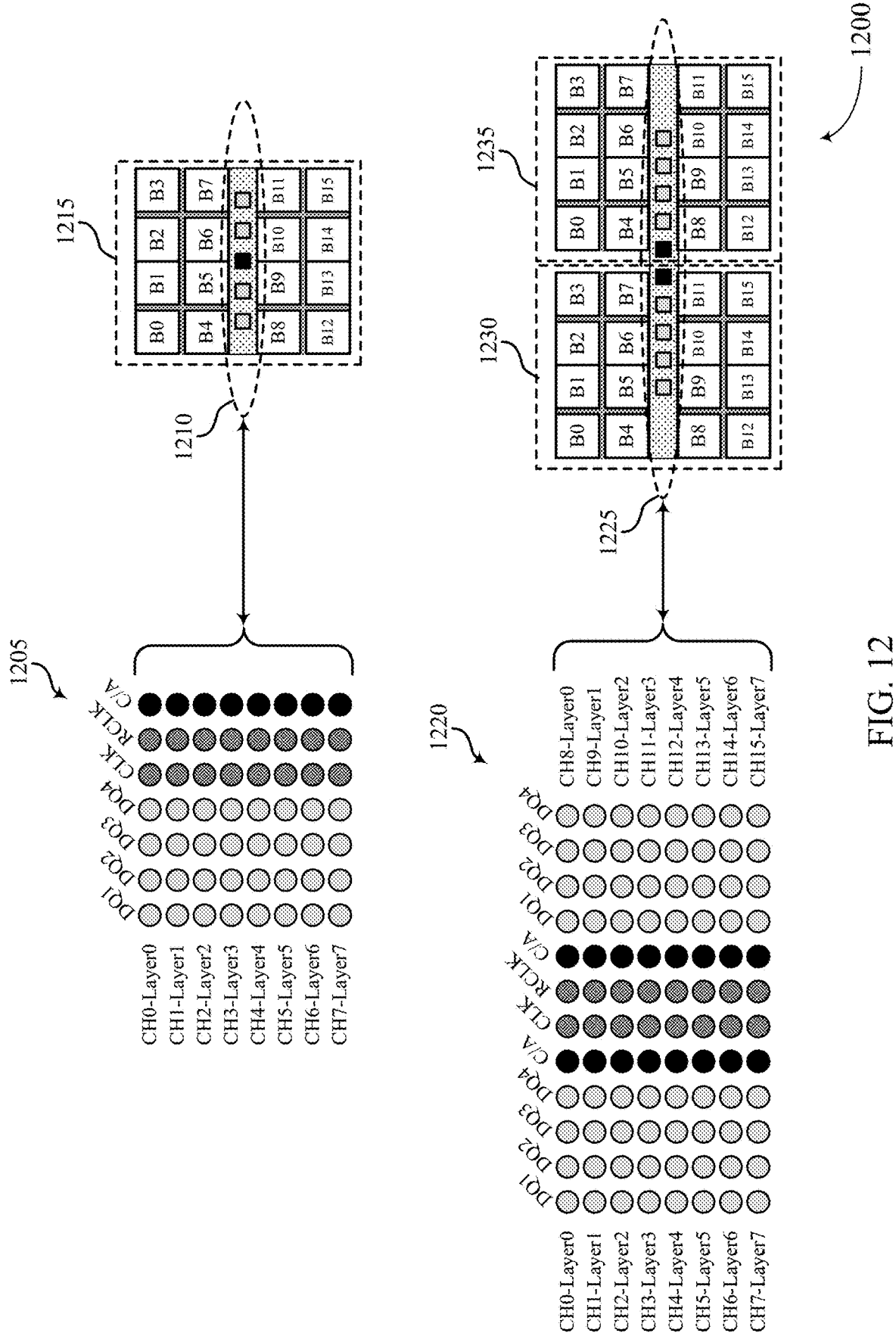
FIG. 12 illustrates an examples of data channels that support a translation system for finer grain memory architectures in accordance with embodiments of the present disclosure.

FIG. 12 illustrates an example of a data channel configurations 1200 that support a translation system for finer grain memory architectures in accordance with various embodiments of the present disclosure. The data channel configuration 1200 may be an example of a channels 225, 710-725, and 810-725 described with reference to FIGS. 2, 7, and 8. A first data channel configuration 1205 illustrates an independent data channel 1210 that services a first cell region 1215. A second data channel configuration 1220 illustrates a data channel pair 1225 where data channels for two cell regions (e.g., second cell region 1230 and third cell region 1235) share clock pins.

The data channel 1210 illustrates a data channel for a stacked memory device that includes eight layers that has a channel width of four (e.g., there are four data pins). Each row of pins in the data channel 1210 are associated with a cell region in a separate layer. The first cell region 1215 illustrates a cell region of only a single layer. As such, the first cell region 1215 is associated with a single row of the pins of the data channel 1210. The quantity of pins in a data channel may be based on the quantity of layers in the memory device because a single data channel may be configured to couple with multiple layers.

In some cases, the term data channel may refer to pins associated with a single cell region of a single layer. In some cases, the term data channel may refer to pins associated with multiple cell regions across multiple layers. In some examples, data channels are coupled with only a single cell region of any given layer or memory die. The same is also true for the data channel pair 1225 of the second data channel configuration 1220. The data channel pair 1225 shows pins for cell regions across multiple layers of the memory device. While data channel 1210 and data channel pair 1225 shown are associated with cell regions in eight layers, any quantity of layers are possible. For example, the data channel 1210 and data channel pair 1225 may be associated with cell regions in one, two, three, four, five, six, seven, eight, nine, ten, eleven, twelve, thirteen, fourteen, fifteen, or sixteen layers of the memory device.

The data channel 1210 includes four data pins (DQ0-DQ4), a clock pin (CLK), a register clock pin (RCLK), and a command/address pin (CA). In other cases, the data channel may have a different rank or different channel width. In such situations, the quantity of data pins may be different. For example, the data channel 1210 may have a channel width of eight and may include eight data pins. Any quantity of data pins associated with a region are contemplated by this disclosure. The data channel 1210 may include any quantity of C/A pins. For example, the data channel 1210 may include one, two, three, or four C/A pins. In some cases, the data channel 1210 may include an error correction code (ECC) pin (not shown) for facilitating error detection and correction procedures.

The data channel pair 1225 is similarly embodied as the data channel 1210 except that two data channels associated with two different cell regions are configured to share clock pins. As such, in the data channel pair 1225, the clock pins (e.g., CLK and RCLK) are coupled with two cell regions of the same layer of the memory device, while the other pins of the data channel pair 1225 (e.g., DQ pins, C/A pins, ECC pins) are coupled with a single cell region of a single layer. For example, the illustrated data channel pair 1225 has a width of four. As such, four data pins and one C/A pin (e.g., CH0-Layer0) are coupled with the second cell region 1230 and four data pins and one C/A pin (CH8-Layer0) are coupled with the third cell region 1235.

The data channel pair 1225 may reduce the complexity of a memory device and the power consumption of the memory device. For example, by sending a single set of clock signals to two cell regions in a layer, it may reduce the quantity of clock components in the memory device and thereby reduce the amount of power to drive the clock signals.

The translation device 400 may be configured to map the channel configuration 1205 or the channel configuration 1220 to a different channel configuration, such as an HBM channel. The translation device 400 may also be configured to map clock signals and command signals to different clock pins and C/A pins. The channel configurations 1205, 1220 may have different C/A pins, CLK pins, and RCLK pins than other channel configurations.

Figure 13:
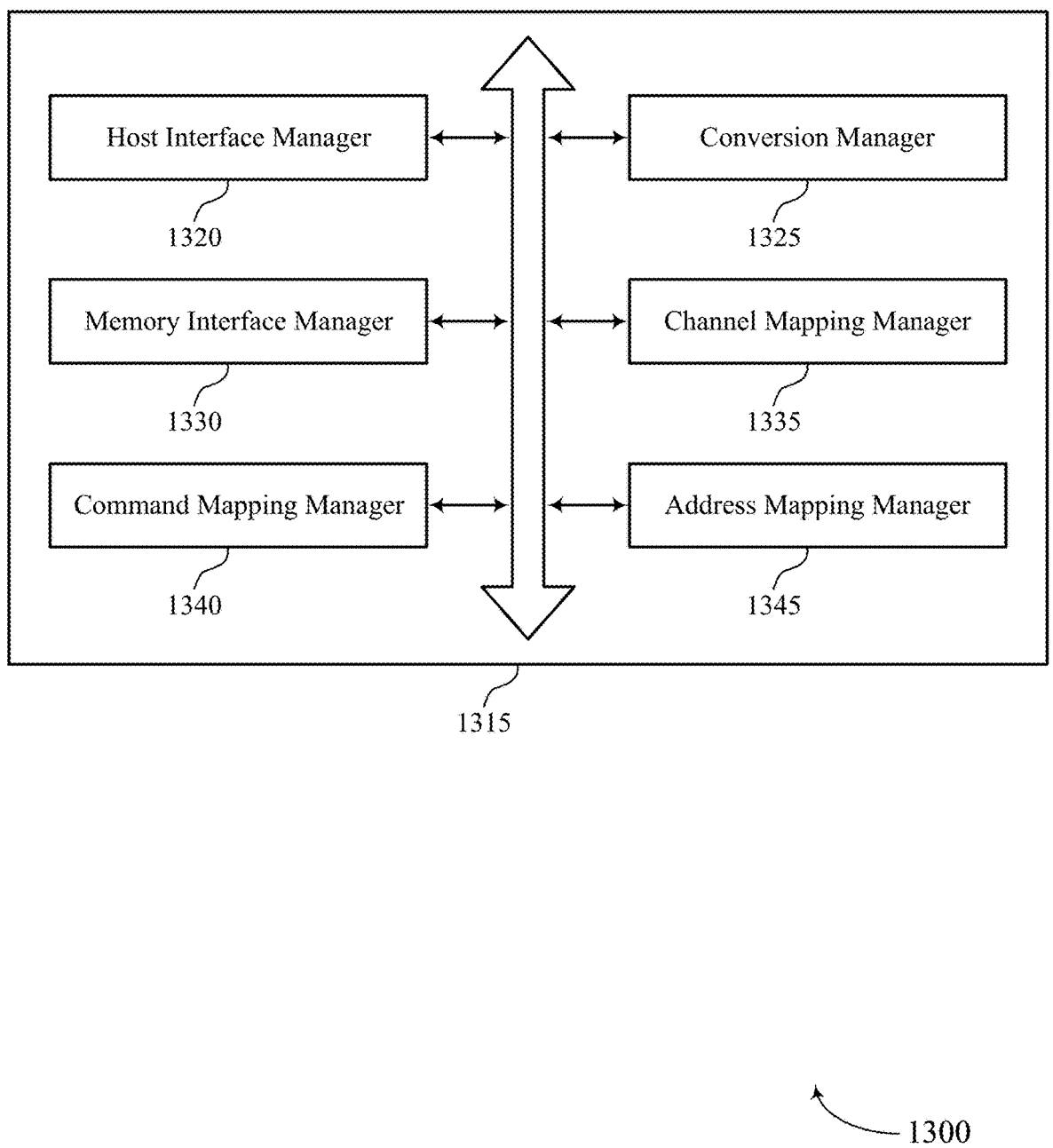
FIG. 13 illustrates a block diagram of a device that supports a translation system for finer grain memory architectures in accordance with embodiments of the present disclosure.

FIG. 13 shows a block diagram 1300 of a translation component 1315 of a translation device that supports a translation system for finer grain memory architectures in accordance with various embodiments of the present disclosure. The translation component 1315 may be an example of aspects of a translation component 415 described with reference to FIG. 4. The translation device may be an example of the translation devices 205, 305, 400 described with reference to FIGS. 2-4. The translation component 1315 may include host interface manager 1320, conversion manager 1325, memory interface manager 1330, channel mapping manager 1335, command mapping manager 1340, and address mapping manager 1345. Each of these modules may communicate, directly or indirectly, with one another (e.g., via one or more buses).

Host interface manager 1320 may receive, from a host device over a set of silicon interposer channels, a first message encoded using a first communication protocol and transmit the fourth message to the host device over the set of silicon interposer channels.

Conversion manager 1325 may generate, based on receiving the first message, a second message encoded using a second communication protocol different from the first communication protocol and generate, based on receiving the third message, a fourth message encoded using the first communication protocol.

Memory interface manager 1330 may transmit the second message to a memory device over a set of organic substrate channels and receive, from the memory device over the set of organic substrate channels, a third message encoded using the second communication protocol.

Channel mapping manager 1335 may partition the second message into two or more portions, where transmitting the second message includes transmitting each portion of the second message across a different organic substrate channel, where multiple organic substrate channels are used to transmit the second message received over the single silicon interposer channel and map the second message to a single organic substrate channel, the second message having a second burst length greater than the first burst length.

Command mapping manager 1340 may identify a first command associated with the first communication protocol included in the first message and generate a second command associated with the second communication protocol that corresponds to the first command, where transmitting the second message includes transmitting the second command.

Address mapping manager 1345 may identify a first memory address in the first message received from the host device, the first memory address being a memory location expected by the host device based on communicating using the first communication protocol and map the first memory address to a second memory address of the memory device, where generating the second message that includes the second memory address is based on mapping the first memory address to the second memory address. In some cases, the first memory address includes a first bank address associated with the memory location expected by the host device and the second memory address includes a second bank address associated with the memory device.

Figure 14:
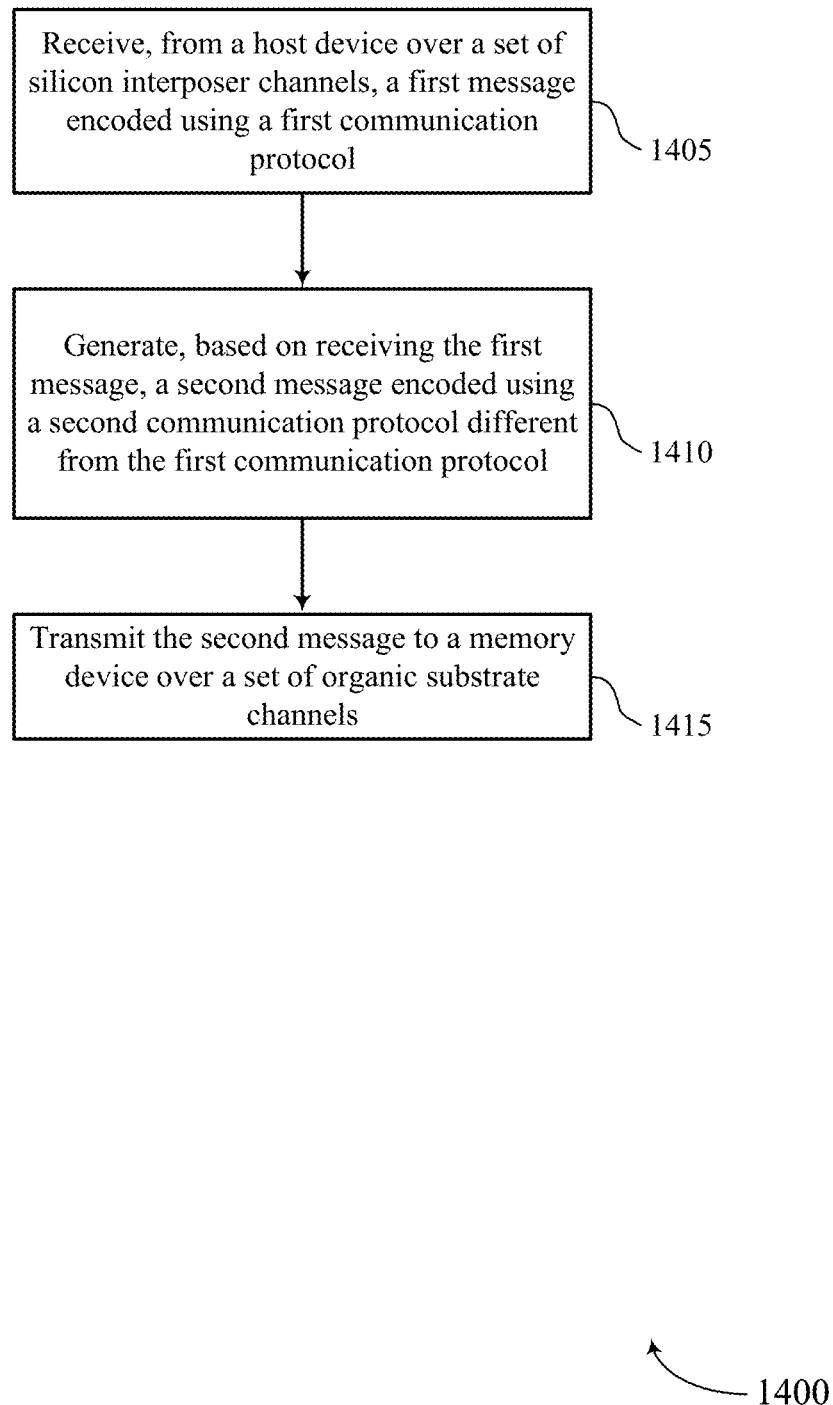
FIGS. 14-16 illustrate methods for a translation system for finer grain memory architectures in accordance with embodiments of the present disclosure.

FIG. 14 shows a flowchart illustrating a method 1400 for a translation system for finer grain memory architectures in accordance with various embodiments of the present disclosure. The operations of method 1400 may be implemented by a translation device 400 or its components as described herein. For example, the operations of method 1400 may be performed by a translation component 415, 1315 as described with reference to FIGS. 4 and 13. In some examples, a translation device 400 may execute a set of codes to control the functional elements of the device to perform the functions described below. Additionally or alternatively, the translation device 400 may perform aspects of the functions described below using special-purpose hardware.

At block 1405, the translation device 400 may receive, from a host device over a plurality of silicon interposer channels, a first message encoded using a first communication protocol. The operations of block 1405 may be performed according to the methods described herein. In certain examples, aspects of the operations of block 1405 may be performed by a host interface manager as described with reference to FIG. 13.

At block 1410, the translation device 400 may generate, based at least in part on receiving the first message, a second message encoded using a second communication protocol different from the first communication protocol. The operations of block 1410 may be performed according to the methods described herein. In certain examples, aspects of the operations of block 1410 may be performed by a conversion manager as described with reference to FIG. 13.

At block 1415, the translation device 400 may transmit the second message to a memory device over a plurality of organic substrate channels. The operations of block 1415 may be performed according to the methods described herein. In certain examples, aspects of the operations of block 1415 may be performed by a memory interface manager as described with reference to FIG. 13.

The method 1400 may be performed by an apparatus that includes means for performing the various functions of the method 1400. The apparatus may include means for receiving, from a host device over a plurality of silicon interposer channels, a first message encoded using a first communication protocol, means for generating, based at least in part on receiving the first message, a second message encoded using a second communication protocol different from the first communication protocol, and means for transmitting the second message to a memory device over a plurality of organic substrate channels.

Some examples of the method 1400 and apparatus described above may further include processes, features, means, or instructions for partitioning the second message into two or more portions, wherein transmitting the second message includes transmitting each portion of the second message across a different organic substrate channel, wherein multiple organic substrate channels may be used to transmit the second message received over the single silicon interposer channel.

Some examples of the method 1400 and apparatus described above may further include processes, features, means, or instructions for mapping the second message to a single organic substrate channel, the second message having a second burst length greater than the first burst length.

Some examples of the method 1400 and apparatus described above may further include processes, features, means, or instructions for identifying a first command associated with the first communication protocol included in the first message. Some examples of the method 1400 and apparatus described above may further include processes, features, means, or instructions for generating a second command associated with the second communication protocol that corresponds to the first command, wherein transmitting the second message comprises transmitting the second command.

Some examples of the method 1400 and apparatus described above may further include processes, features, means, or instructions for identifying a first memory address in the first message received from the host device, the first memory address being a memory location expected by the host device based at least in part on communicating using the first communication protocol. Some examples of the method 1400 and apparatus described above may further include processes, features, means, or instructions for mapping the first memory address to a second memory address of the memory device, wherein generating the second message that includes the second memory address may be based at least in part on mapping the first memory address to the second memory address.

In some examples of the method 1400 and apparatus described above, the first memory address includes a first bank address associated with the memory location expected by the host device and the second memory address includes a second bank address associated with the memory device.

Some examples of the method 1400 and apparatus described above may further include processes, features, means, or instructions for receiving, from the memory device over the plurality of organic substrate channels, a third message encoded using the second communication protocol. Some examples of the method 1400 and apparatus described above may further include processes, features, means, or instructions for generating, based at least in part on receiving the third message, a fourth message encoded using the first communication protocol. Some examples of the method 1400 and apparatus described above may further include processes, features, means, or instructions for transmitting the fourth message to the host device over the plurality of silicon interposer channels.

Figure 15:
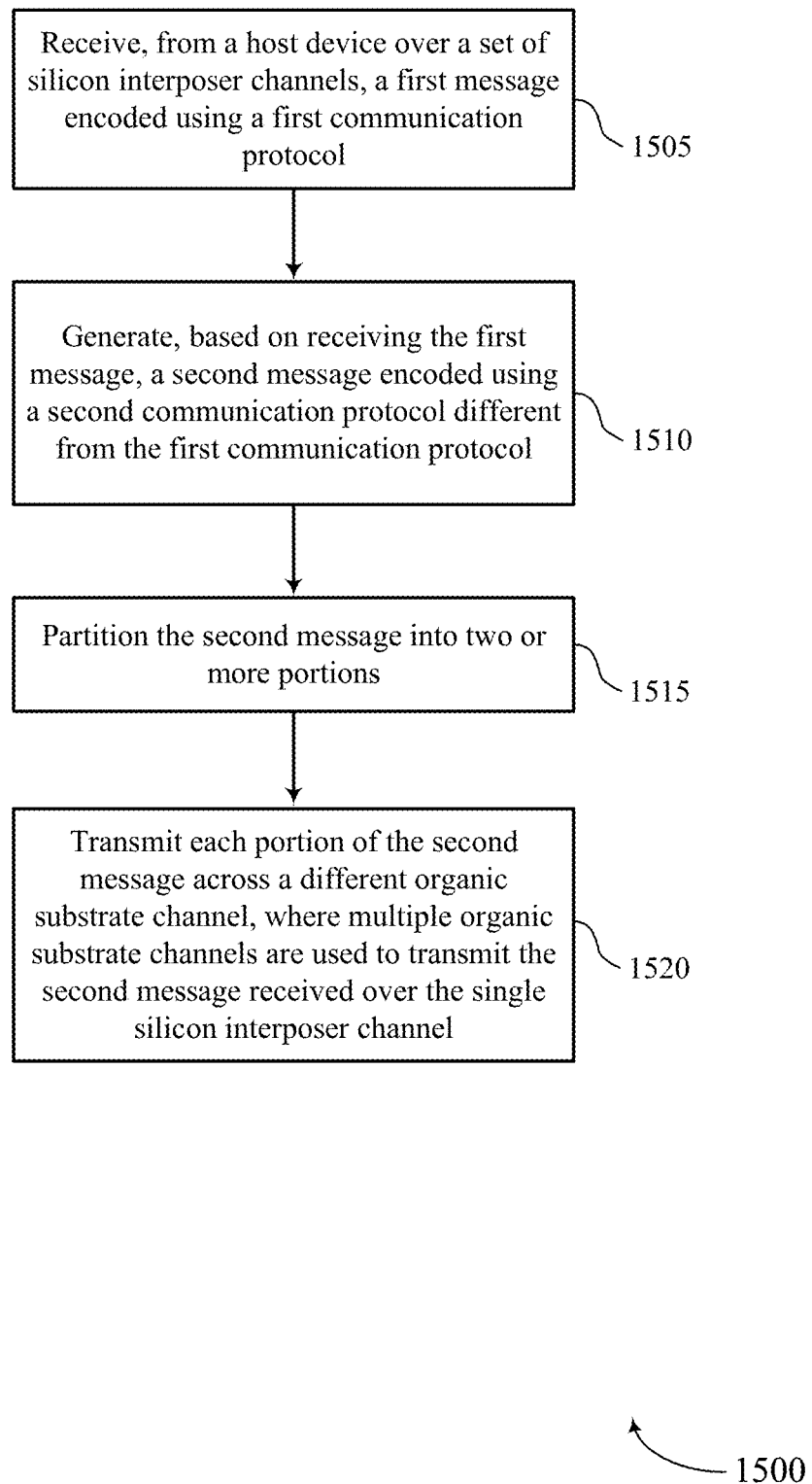

FIG. 15 shows a flowchart illustrating a method 1500 for undefined in accordance with aspects of the present disclosure. The operations of method 1500 may be implemented by a translation device 400 or its components as described herein. For example, the operations of method 1500 may be performed by a translation component 415, 1315 as described with reference to FIGS. 4 and 13. In some examples, a translation device 400 may execute a set of codes to control the functional elements of the device to perform the functions described below. Additionally or alternatively, the translation device 400 may perform aspects of the functions described below using special-purpose hardware.

At block 1505, the translation device 400 may receive, from a host device over a plurality of silicon interposer channels, a first message encoded using a first communication protocol. The operations of block 1505 may be performed according to the methods described herein. In certain examples, aspects of the operations of block 1505 may be performed by a host interface manager as described with reference to FIG. 13.

At block 1510, the translation device 400 may generate, based at least in part on receiving the first message, a second message encoded using a second communication protocol different from the first communication protocol. The operations of block 1510 may be performed according to the methods described herein. In certain examples, aspects of the operations of block 1510 may be performed by a conversion manager as described with reference to FIG. 13.

At block 1515, the translation device 400 may partition the second message into two or more portions. The operations of block 1515 may be performed according to the methods described herein. In certain examples, aspects of the operations of block 1515 may be performed by a channel mapping manager as described with reference to FIG. 13.

At block 1520, the translation device 400 may transmit each portion of the second message across a different organic substrate channel, where multiple organic substrate channels are used to transmit the second message received over the single silicon interposer channel. The operations of block 1520 may be performed according to the methods described herein. In certain examples, aspects of the operations of block 1520 may be performed by a memory interface manager as described with reference to FIG. 13.

Figure 16:
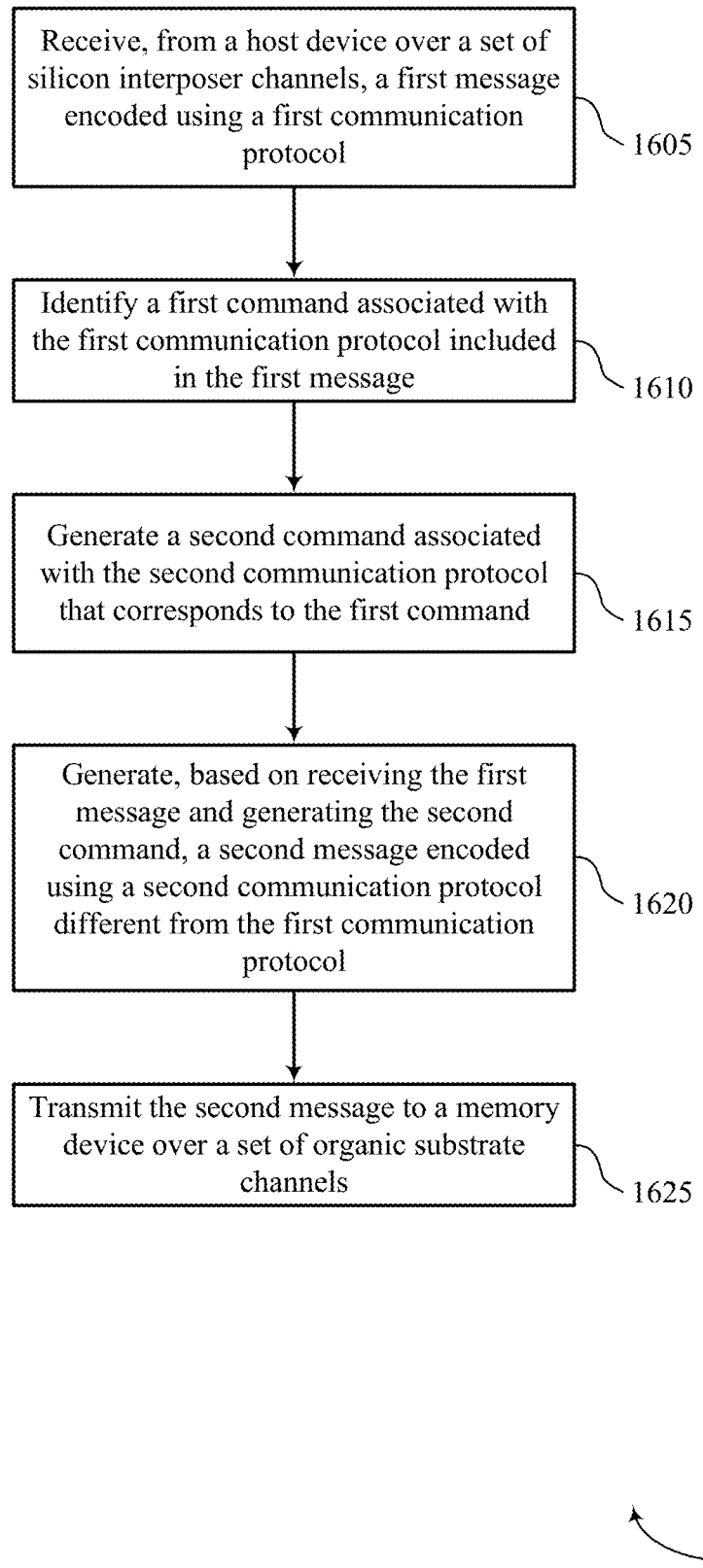

FIG. 16 shows a flowchart illustrating a method 1600 for undefined in accordance with aspects of the present disclosure. The operations of method 1600 may be implemented by a translation device 400 or its components as described herein. For example, the operations of method 1600 may be performed by a translation component 415, 1315 as described with reference to FIGS. 4 and 13. In some examples, a translation device 400 may execute a set of codes to control the functional elements of the device to perform the functions described below. Additionally or alternatively, the translation device 400 may perform aspects of the functions described below using special-purpose hardware.

At block 1605, the translation device 400 may receive, from a host device over a plurality of silicon interposer channels, a first message encoded using a first communication protocol. The operations of block 1605 may be performed according to the methods described herein. In certain examples, aspects of the operations of block 1605 may be performed by a host interface manager as described with reference to FIG. 13.

At block 1610, the translation device 400 may identify a first command associated with the first communication protocol included in the first message. The operations of block 1610 may be performed according to the methods described herein. In certain examples, aspects of the operations of block 1610 may be performed by a command mapping manager as described with reference to FIG. 13.

At block 1615, the translation device 400 may generate a second command associated with the second communication protocol that corresponds to the first command. The operations of block 1615 may be performed according to the methods described herein. In certain examples, aspects of the operations of block 1615 may be performed by a command mapping manager as described with reference to FIG. 13.

At block 1620, the translation device 400 may generate, based at least in part on receiving the first message and generating the second command, a second message encoded using a second communication protocol different from the first communication protocol. The operations of block 1620 may be performed according to the methods described herein. In certain examples, aspects of the operations of block 1620 may be performed by a conversion manager as described with reference to FIG. 13.

At block 1625, the translation device 400 may transmit the second message to a memory device over a plurality of organic substrate channels. The operations of block 1625 may be performed according to the methods described herein. In certain examples, aspects of the operations of block 1625 may be performed by a memory interface manager as described with reference to FIG. 13.

It should be noted that the methods described above describe possible implementations, and that the operations and the steps may be rearranged or otherwise modified and that other implementations are possible. Further, aspects from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

Chalcogenide materials may be materials or alloys that include at least one of the elements S, Se, and Te. Phase change materials discussed herein may be chalcogenide materials. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Embodiments are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three-terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A system, comprising:
a silicon interposer configured to support host-to-memory communications and memory-to-host communications using a high bandwidth memory (HBM) communication protocol, the silicon interposer comprising a first area for a host die, a second area for a memory die, and a first plurality of channels between the first area and the second area, wherein the first plurality of channels supports the HBM communication protocol;
a host device positioned on the first area of the silicon interposer for the host die, the host device having a first pin layout and being configured to communicate with memory devices via the first plurality of channels using the HBM communication protocol;
a memory device that comprises one or more arrays of memory cells configured to write data from or read data to the host device and logic for implementing at least a portion of operations associated with a memory controller of the memory device, wherein the memory device has a second pin layout different than the first pin layout and is configured to communicate with host devices using a second communication protocol that is different than the HBM communication protocol; and a translation device positioned on the second area of the silicon interposer for the memory die, distinct from the logic for implementing at least the portion of operations associated with the memory controller, and coupled with the host device via the first plurality of channels in the silicon interposer and with the memory device controller via a second plurality of channels in an organic substrate that is coupled with the translation device and the memory device, the second plurality of channels supporting the second communication protocol, wherein the translation device is configured to:

communicate with the host device via the first plurality of channels in the silicon interposer using the HBM communication protocol and with the memory controller via the second plurality of channels in the organic substrate using the second communication protocol, and map the first pin layout to the second pin layout.

2. The system of claim 1, wherein the silicon interposer is positioned between the translation device and a package substrate.

3. The system of claim 1, further comprising:
a second organic substrate coupled with the silicon interposer and the organic substrate.

4. The system of claim 1, wherein the first plurality of channels is configured for a first operating frequency and the second plurality of channels is configured for a second operating frequency different than the first operating frequency.

5. The system of claim 1, wherein the first plurality of channels comprise wiring within the silicon interposer.

6. The system of claim 1, wherein the second plurality of channels comprise wiring within the organic substrate.

7. The system of claim 6, wherein a portion of at least one channel of the second plurality of channels extends through the silicon interposer.

8. The system of claim 1, wherein a quantity of the first plurality of channels is less than a quantity of the second plurality of channels.

9. The system of claim 1, wherein the second plurality of channels extend from the translation device, through the silicon interposer, through the organic substrate, and to the memory controller, wherein the organic substrate is positioned beneath the silicon interposer.

10. The system of claim 1, wherein a portion of at least one channel of the second plurality of channels comprises wiring within the silicon interposer.

11. The system of claim 1, wherein the HBM communication protocol is configured to be communicated across the silicon interposer.

12. The system of claim 1, wherein the memory device includes the organic substrate, the organic substrate being coupled with a package substrate.

13. A device, comprising:
a first interface in electronic communication with a host device over a silicon interposer, the first interface configured to communicate with the host device using a high bandwidth memory (HBM) communication protocol and a first burst length, wherein the silicon interposer is configured to support host-to-memory communications and memory-to-host communications using the HBM communication protocol and comprises a first area for a host die, a second area for a memory die, and a first plurality of channels between the first area and the second area that supports the HBM communication protocol, wherein the first interface is configured to couple with the first plurality of channels, and wherein the host device is positioned on the first area;

a second interface in electronic communication with a memory controller of a memory device using a second communication protocol and a second burst length different than the HBM communication protocol and the first burst length, the memory controller of the memory device comprising logic for implementing at least a portion of operations associated with the memory controller, wherein the second interface is configured to couple with a second plurality of channels in an organic substrate, the second plurality of channels supporting the second communication protocol; and a translation component configured to receive, from the host device via the first plurality of channels, signaling according to the HBM communication protocol and the first burst length and transmit, to the memory controller via the second plurality of channels, signaling according to the second communication protocol and the second burst length, wherein the translation component is positioned on the second area and distinct from the logic for implementing at least the portion of operations associated with the memory controller.

14. The device of claim 13, wherein the translation component is configured to receive, from the memory controller via the second plurality of channels, signaling according to the second communication protocol and transmit, to the host device via the first plurality of channels, signaling according to the HBM communication protocol.

15. The device of claim 13, wherein:
the first plurality of channels are formed using silicon interposer wiring; and
the second plurality of channels are formed using organic substrate wiring.

16. The device of claim 13, wherein the HBM communication protocol is configured to be communicated across the silicon interposer.

17. The device of claim 16, wherein the first interface comprises an HBM physical layer (PHY).

18. The device of claim 16, wherein the first interface comprises a physical layer (PHY) configured to support pulse amplitude modulation (PAM).

19. The device of claim 13, wherein the translation component is configured to convert signaling between the HBM communication protocol and the second communication protocol based at least in part on the host device being configured to communicate using the HBM communication protocol and the memory controller being configured to communicate using the second communication protocol.

20. A system, comprising:
a silicon interposer configured to support host-to-memory communications and memory-to-host communications using a high bandwidth memory (HBM) communication protocol, the silicon interposer comprising a first area for a host die, a second area for a memory die;
a host device positioned on the first area of the silicon interposer;
a memory device that comprises an array of memory cells configured to write data from or read data to the host device and logic for implementing at least a portion of operations associated with a memory controller of the memory device;
a translation device positioned on the second area of the silicon interposer and coupled with the host device and the memory controller, wherein the translation device is distinct from the logic for implementing at least the portion of operations associated with the memory controller;

an organic substrate that is coupled with the translation device and the memory device;

a first plurality of channels in the silicon interposer and extending between the first area for the host die and the second area for the memory die and configured to communicate signals between the host device and the translation device using the HBM communication protocol, the first plurality of channels associated with a first pin layout of the host device; and a second plurality of channels in the organic substrate and extending between the translation device and the memory controller and configured to communicate signals between the translation device and the memory controller using a second communication protocol different than the HBM communication protocol, the second plurality of channels associated with a second pin layout of the memory device different than the first pin layout, wherein the translation device is configured to map the first pin layout to the second pin layout.

21. The system of claim 1, wherein the HBM communication protocol is associated with a first operating frequency and a first data rate and the second communication protocol is associated with a second operating frequency and a second data rate.

22. The system of claim 1, wherein the HBM communication protocol is associated with a first modulation scheme having a first quantity of levels and the second communication protocol is associated with a second modulation scheme having a second quantity of levels different that the first quantity of levels.

23. The system of claim 1, wherein the translation device is further configured to:
convert a command received from the host device from a first format associated with the HBM communication protocol to a second format associated with the second communication protocol to obtain a converted command; and
transmit the converted command to the memory controller of the memory device.

* * * * *